United States Patent
Kuo et al.

(10) Patent No.: US 12,512,331 B2
(45) Date of Patent: Dec. 30, 2025

(54) DUMMY THROUGH VIAS FOR INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Chien-Li Kuo, Hsinchu (TW); Chien-Chen Li, Hsinchu (TW); Kuo-Chio Liu, Hsinchu (TW); Kuang-Chun Lee, New Taipei (TW); Wen-Yi Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 649 days.

(21) Appl. No.: 17/751,234

(22) Filed: May 23, 2022

(65) Prior Publication Data

US 2023/0377905 A1    Nov. 23, 2023

(51) Int. Cl.
| | |
|---|---|
| *H01L 21/48* | (2006.01) |
| *H01L 23/00* | (2006.01) |
| *H01L 23/31* | (2006.01) |
| *H01L 23/48* | (2006.01) |
| *H01L 23/498* | (2006.01) |
| *H01L 23/538* | (2006.01) |

(52) U.S. Cl.
CPC ........ *H01L 21/486* (2013.01); *H01L 23/3128* (2013.01); *H01L 23/481* (2013.01); *H01L 23/49816* (2013.01); *H01L 23/49827* (2013.01); *H01L 23/5389* (2013.01); *H01L 24/19* (2013.01); *H01L 24/73* (2013.01); *H01L 2224/04105* (2013.01); *H01L 2224/12105* (2013.01); *H01L 2224/73267* (2013.01); *H01L 2924/15311* (2013.01)

(58) Field of Classification Search
CPC . H01L 21/486; H01L 23/3128; H01L 23/481; H01L 23/49816; H01L 23/49827; H01L 23/5389; H01L 24/19; H01L 24/73; H01L 2224/04105; H01L 2224/12105; H01L 2224/73267; H01L 2924/15311
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Jacob Y Choi
*Assistant Examiner* — Neil R Prasad
(74) *Attorney, Agent, or Firm* — Slater Matsil, LLP

(57) ABSTRACT

In an embodiment, a device includes: an integrated circuit die including a die connector; a first through via adjacent the integrated circuit die; an encapsulant encapsulating the first through via and the integrated circuit die; and a redistribution structure on the encapsulant, the redistribution structure including a redistribution line, the redistribution line physically and electrically coupled to the die connector of the integrated circuit die, the redistribution line electrically isolated from the first through via, the redistribution line crossing over the first through via.

20 Claims, 19 Drawing Sheets

(56) References Cited

U.S. PATENT DOCUMENTS

| | | | |
|---|---|---|---|
| 9,368,460 B2 | 6/2016 | Yu et al. | |
| 9,372,206 B2 | 6/2016 | Wu et al. | |
| 9,496,189 B2 | 11/2016 | Yu et al. | |
| 2018/0053732 A1* | 2/2018 | Baek | H01L 23/5389 |
| 2018/0261557 A1* | 9/2018 | Yu | H01L 23/562 |
| 2020/0083176 A1* | 3/2020 | Lim | H01L 24/20 |
| 2020/0273799 A1* | 8/2020 | Sung | H01L 24/17 |
| 2021/0335736 A1* | 10/2021 | Kang | H01L 24/13 |
| 2022/0262768 A1* | 8/2022 | Chen | H01L 23/3135 |

* cited by examiner

DUMMY THROUGH VIAS FOR INTEGRATED CIRCUIT PACKAGES AND METHODS OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
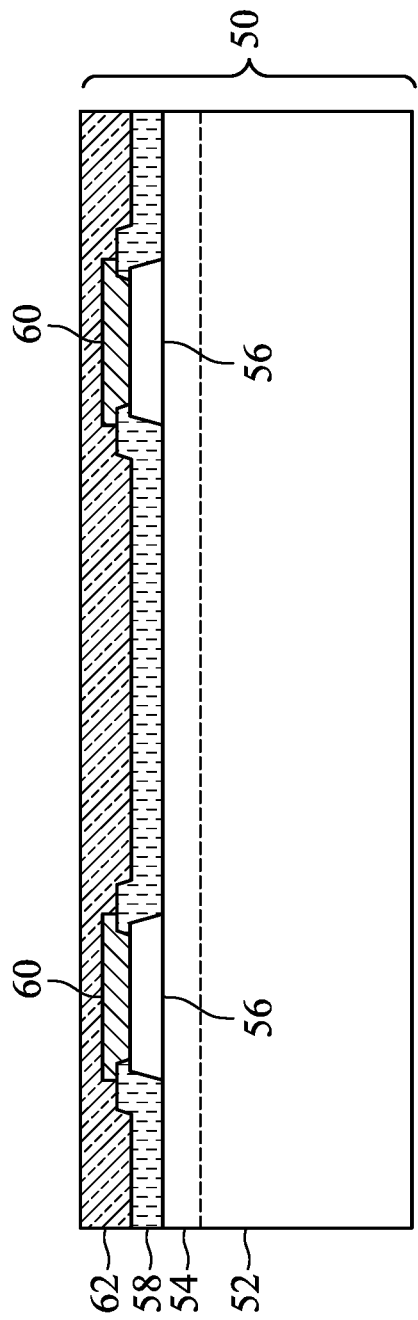
FIG. 1 is a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, dummy through vias are formed through an encapsulant in regions where there is a mismatch in coefficients of thermal expansion, such as proximate the border (e.g., edges and/or corners) of an encapsulated integrated circuit die. Forming the dummy through vias in such regions may help suppress thermal expansion of the encapsulant during operation or testing. Overlying redistribution lines may thus have a decreased risk of cracking, particularly when the redistribution lines have a small size (e.g., width and/or thickness) and/or a small pitch. Reliability of the resulting devices may thus still be improved.

FIG. 1 is a cross-sectional view of an integrated circuit die 50 in accordance with some embodiments. The integrated circuit die 50 will be packaged in subsequent processing to form an integrated circuit device. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (not separately illustrated) may be formed at the front surface of the semiconductor substrate 52. The devices may be active devices (e.g., transistors, diodes, etc.) and/or passive devices (e.g., capacitors, resistors, etc.). An interconnect structure 54 is over the active surface of the semiconductor substrate 52. The interconnect structure 54 interconnects the devices to form an integrated circuit. The interconnect structure may be formed of, for example, metallization patterns in dielectric layers, and may be formed by a damascene process, such as a single damascene process, a dual damascene process, or the like. The metallization patterns include metal lines and vias formed in one or more dielectric layers. The metallization patterns of the interconnect structure 54 are electrically coupled to the devices.

The integrated circuit die 50 further includes pads 56, such as aluminum pads, to which external connections are made. The pads 56 are at the front side of the integrated circuit die 50, such as in and/or on the interconnect structure 54. One or more passivation films 58 are on the integrated circuit die 50, such as on portions of the interconnect structure 54 and pads 56. Openings extend through the passivation films 58 to the pads 56. Die connectors 60, such as conductive pillars (for example, formed of a metal such as copper), extend through the openings in the passivation films 58 and are physically and electrically coupled to respective ones of the pads 56. The die connectors 60 may be formed by, for example, plating, or the like. The die connectors 60 are electrically coupled to the respective integrated circuits of the integrated circuit die 50.

Optionally, solder regions (e.g., solder balls or solder bumps) may be disposed on the pads 56. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and other dies, which fail the CP testing, are not packaged. After testing, the solder regions may be removed in subsequent processing steps.

A dielectric layer 62 may (or may not) be at the front side of the integrated circuit die 50, such as on the passivation films 58 and the die connectors 60. The dielectric layer 62 laterally encapsulates the die connectors 60, and the dielectric layer 62 is laterally coterminous with the integrated circuit die 50. Initially, the dielectric layer 62 may bury the die connectors 60, such that the top surface of the dielectric layer 62 is above the top surfaces of the die connectors 60. In some embodiments where solder regions are disposed on the die connectors 60, the dielectric layer 62 may bury the solder regions as well. Alternatively, the solder regions may be removed prior to forming the dielectric layer 62.

The dielectric layer 62 may be formed of a polymer such as polybenzoxazole (PBO), polyimide, a benzocyclobutene (BCB) based polymer, or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 62 may be formed, for example, by spin coating, lamination, chemical vapor deposition (CVD), or the like. In some embodiments, the die connectors 60 are exposed through the dielectric layer 62 during formation of the integrated circuit die 50. In some embodiments, the die connectors 60 remain buried and are exposed during a subsequent process for packaging the integrated circuit die 50. Exposing the die connectors 60 may remove any solder regions that may be present on the die connectors 60.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 54.

FIGS. 2-14 are cross-sectional views of intermediate stages in the manufacturing of an integrated circuit device, in accordance with some embodiments. Specifically, the integrated circuit device is formed by packaging one or more integrated circuit dies 50 in a package region 102A. The package region 102A will be singulated in subsequent processing to form a first integrated circuit package 100 (see FIG. 13). Processing of one package region 102A is illustrated, but it should be appreciated that any number of package regions 102A can be simultaneously processed to form any number of first integrated circuit packages 100. The first integrated circuit package 100 may be an integrated fan-out (InFO) package. A second integrated circuit package 200 (see FIG. 13) will be coupled to the first integrated circuit package 100 to form a device stack. The device stack be a package-on-package (PoP) structure. The device stack will then be mounted to a package substrate 300 (see FIG. 14) to form the resulting integrated circuit device.

Figure 2:
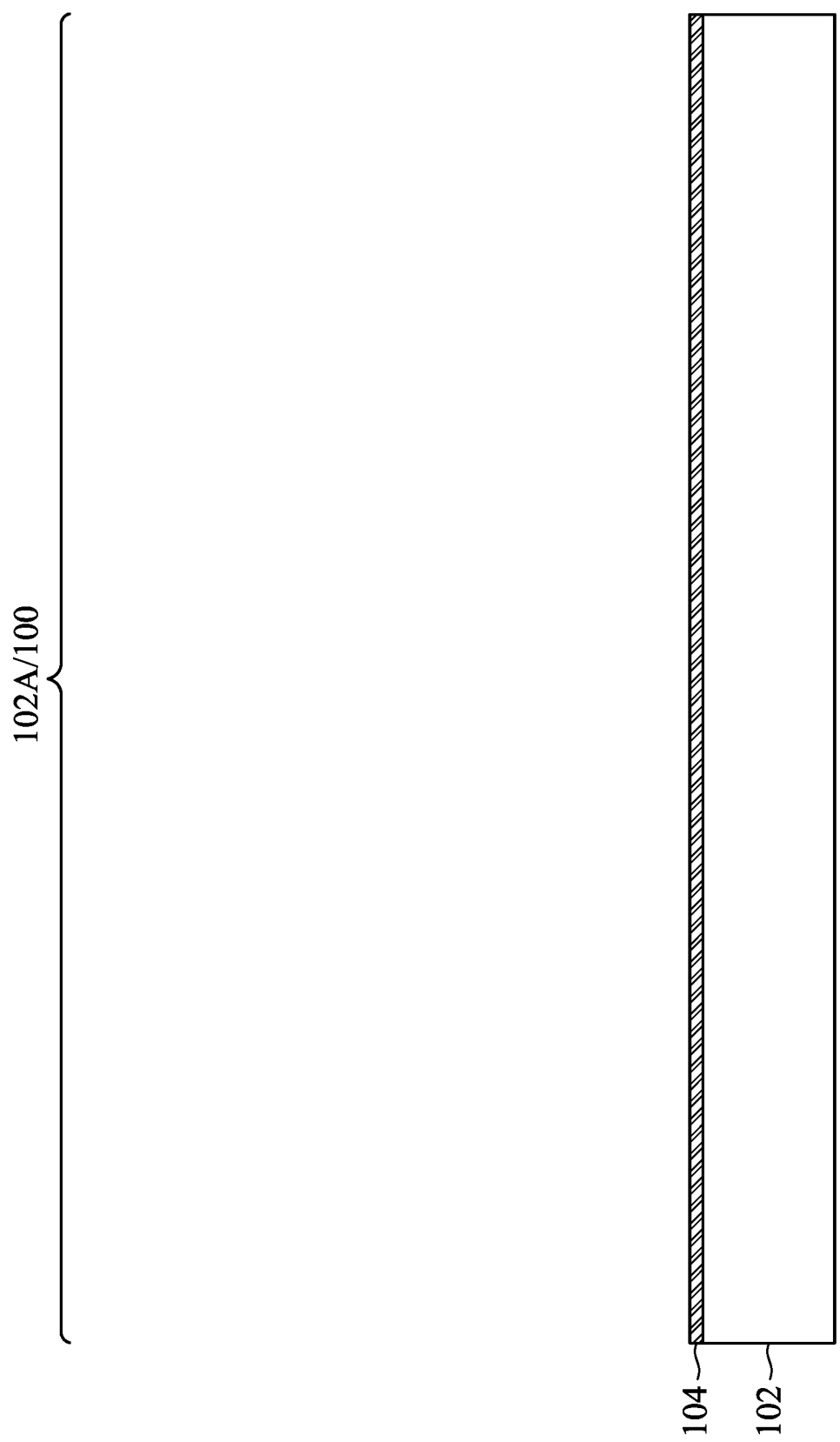
FIGS. 2-14 are cross-sectional views of intermediate stages in the manufacturing of an integrated circuit device, in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
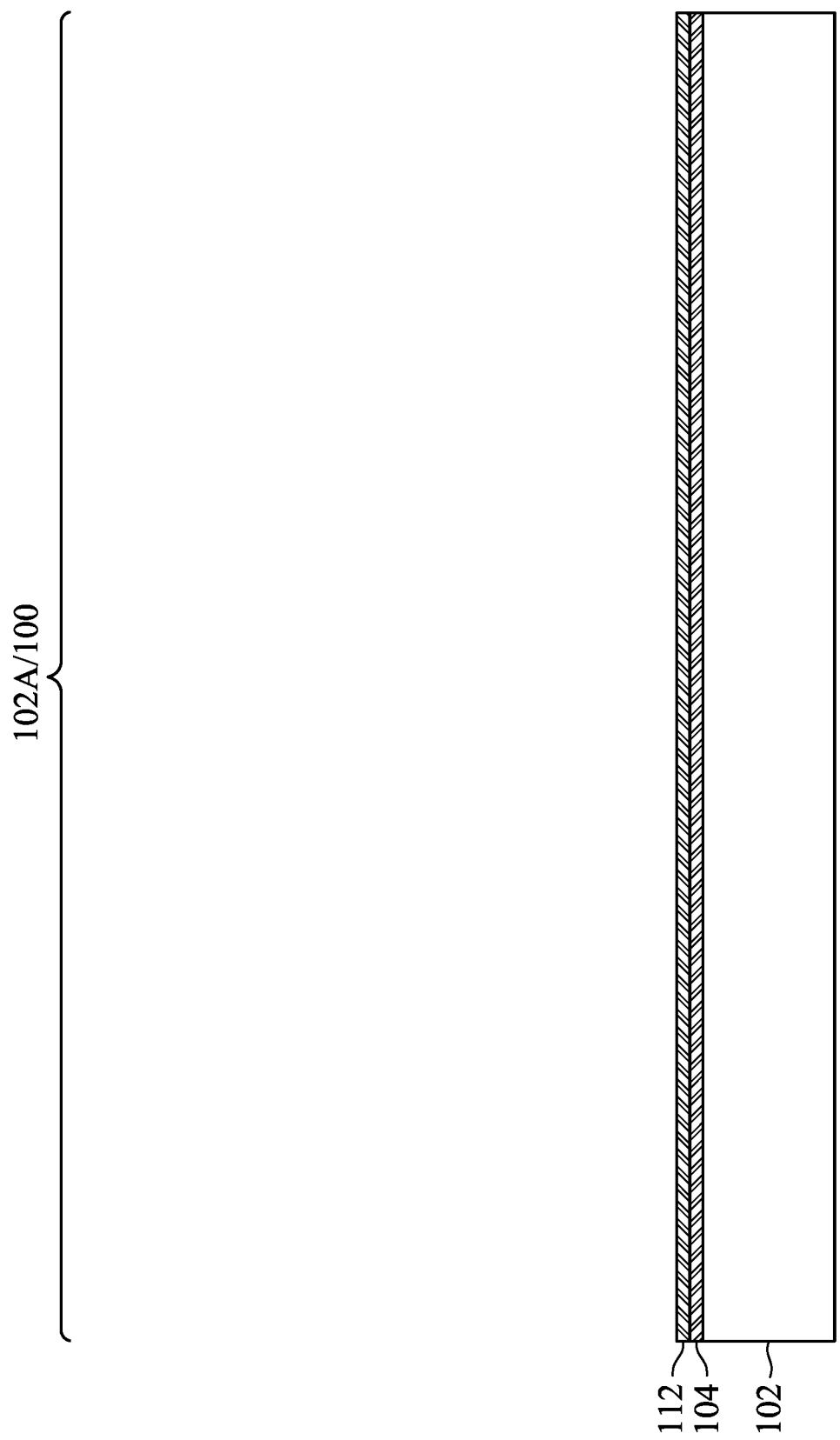

In FIG. 3, a dielectric layer 112 is formed on the release layer 104. The bottom surface of the dielectric layer 112 may be in contact with the top surface of the release layer 104. In some embodiments, the dielectric layer 112 is formed of a polymer, such as polybenzoxazole (PBO), polyimide, a benzocyclobutene (BCB) based polymer, or the like. In other embodiments, the dielectric layer 112 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 112 may be formed by any acceptable deposition process, such as spin coating, CVD, laminating, the like, or a combination thereof.

Figure 4:
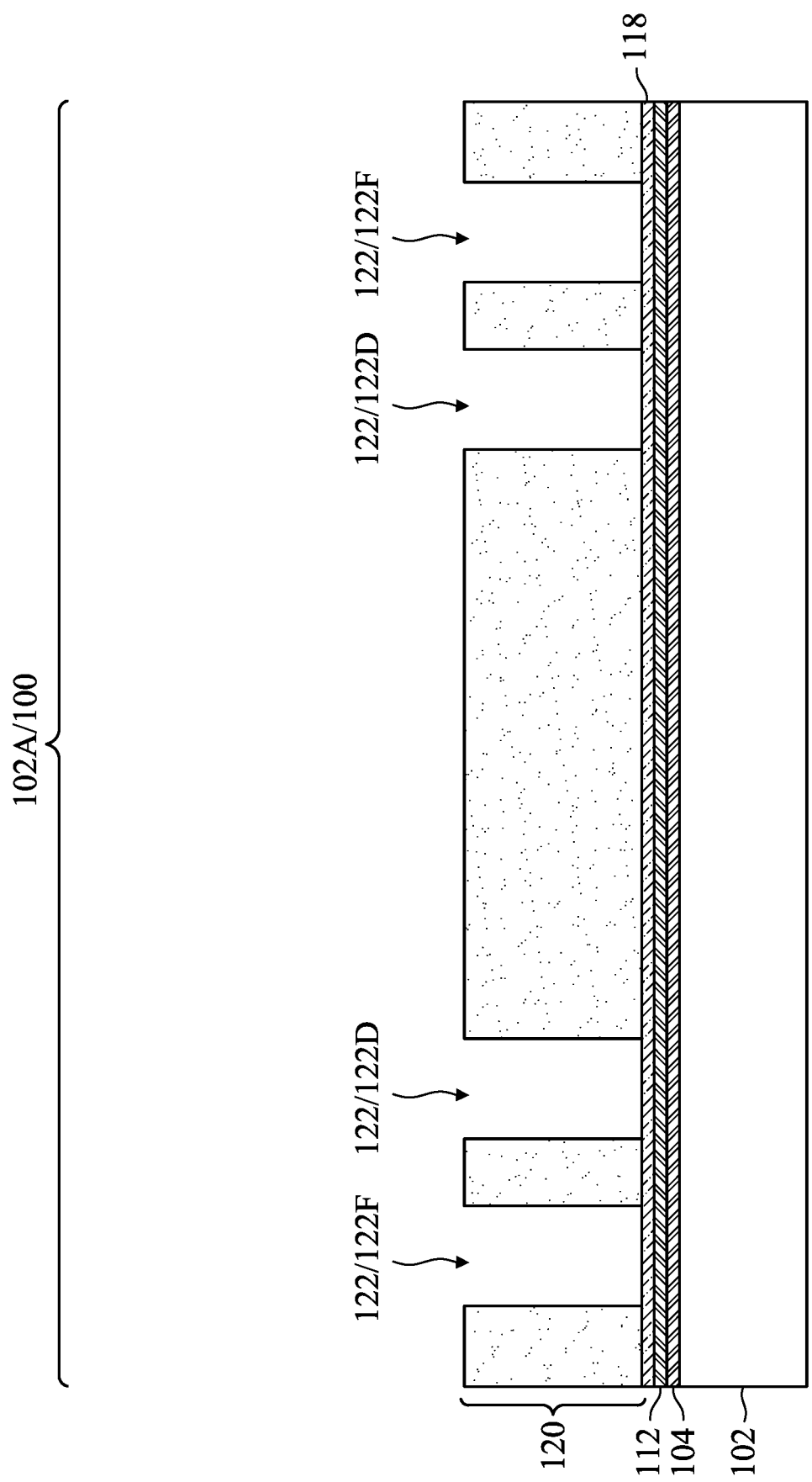
Figure 5:
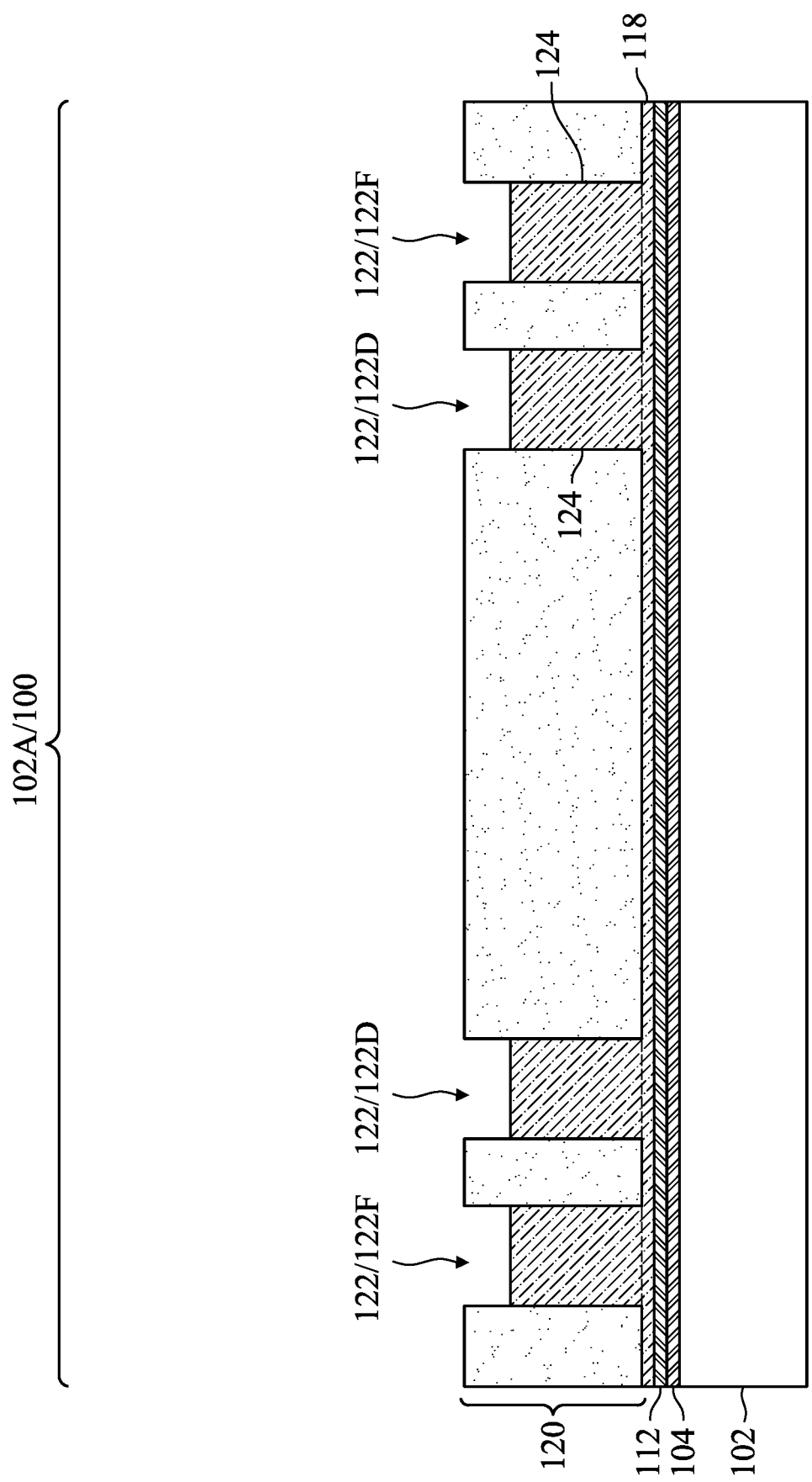
Figure 6:
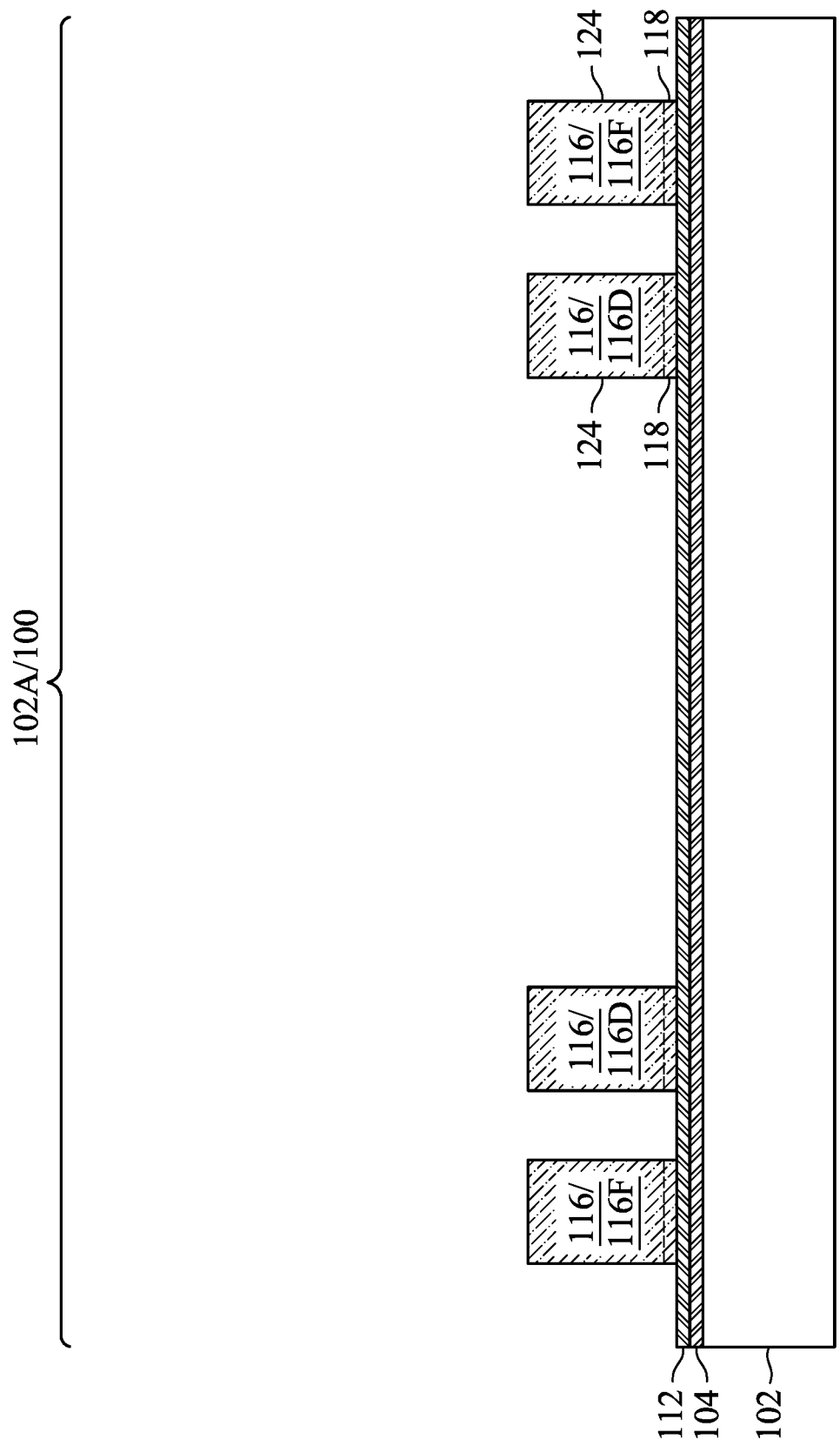

FIGS. 4-6 illustrate a process for forming through vias 116 (see FIG. 6), which may also be referred to as conductive vias. The through vias 116 are formed on and extending away from the dielectric layer 112, and will extend through a subsequently formed encapsulant. As will be subsequently described in greater detail, a first subset of the through vias 116 are functional through vias 116F, and a second subset of the through vias 116 are dummy through vias 116D. The functional through vias 116F will be electrically coupled to subsequently formed overlying redistribution lines, and are used to route signals in the resulting integrated circuit device. The dummy through vias 116D will not be electrically coupled to the subsequently formed overlying redistribution lines, and are not electrically functional. The dummy through vias 116D are disposed beneath the subsequently formed overlying redistribution lines, and suppress thermal expansion of the subsequently formed encapsulant, thereby reducing the risk of the redistribution lines cracking.

In FIG. 4, a seed layer 118 is formed on the dielectric layer 112. In some embodiments, the seed layer 118 is a metal layer, which may be a single layer or a composite layer comprising a plurality of sub-layers formed of different materials. In a particular embodiment, the seed layer 118 comprises a titanium layer and a copper layer over the titanium layer. The seed layer 118 may be formed using, for example, PVD or the like.

A mask 120 is formed and patterned on the seed layer 118. The mask 120 may be a photoresist formed by spin coating or the like and may be exposed to light for patterning. The pattern of the mask 120 corresponds to the through vias 116 (see FIG. 6). The patterning forms openings 122 through the mask 120 to expose the seed layer 118. A first subset of the openings 122F correspond to the functional through vias 116F (see FIG. 6) and a second subset of the openings 122D correspond to the dummy through vias 116D (see FIG. 6). As will be subsequently described in greater detail, the dummy through vias 116D may have different shapes and/or sizes than the functional through vias 116F in a top-down view (see FIG. 15). As an example to form the through vias 116 with different shapes and/or sizes, the openings 122F may be patterned to have different shapes and/or sizes than the openings 122D in a top-down view (not separately illustrated).

In FIG. 5, a conductive material 124 is formed in the openings 122 of the mask 120 and on the exposed portions of the seed layer 118. The conductive material 124 may be formed by plating, such as electroplating or electroless plating, or the like. The conductive material 124 may comprise a metal, like copper, titanium, tungsten, aluminum, or the like.

In FIG. 6, the mask 120 and portions of the seed layer 118 on which the conductive material 124 is not formed are removed. In embodiments where the mask 120 is a photoresist, it may be removed by an acceptable ashing or stripping process, such as using an oxygen plasma or the like. Once the mask 120 is removed, exposed portions of the seed layer 118 are removed, such as by using an acceptable etching process, such as by wet or dry etching. The remaining portions of the seed layer 118 and conductive material 124 form the through vias 116 (including the functional through vias 116F and the dummy through vias 116D).

The functional through vias 116F include the same structure of conductive layers as the dummy through vias 116D. Specifically, the functional through vias 116F and the dummy through vias 116D each include an adhesion layer (corresponding to a portion of the seed layer 118) and a main layer (corresponding to a portion of the conductive material 124). The adhesion layers of the functional through vias 116F are formed of the same conductive material as the adhesion layers of the dummy through vias 116D, and the main layers of the functional through vias 116F are formed of the same conductive material as the main layers of the dummy through vias 116D. In some embodiments, the adhesion layers are formed of titanium and the main layers are formed of copper. Further, the adhesion layers of the functional through vias 116F have the same thickness as the adhesion layers of the dummy through vias 116D, and the main layers of the functional through vias 116F have the same thickness as the main layers of the dummy through vias 116D.

Figure 7:
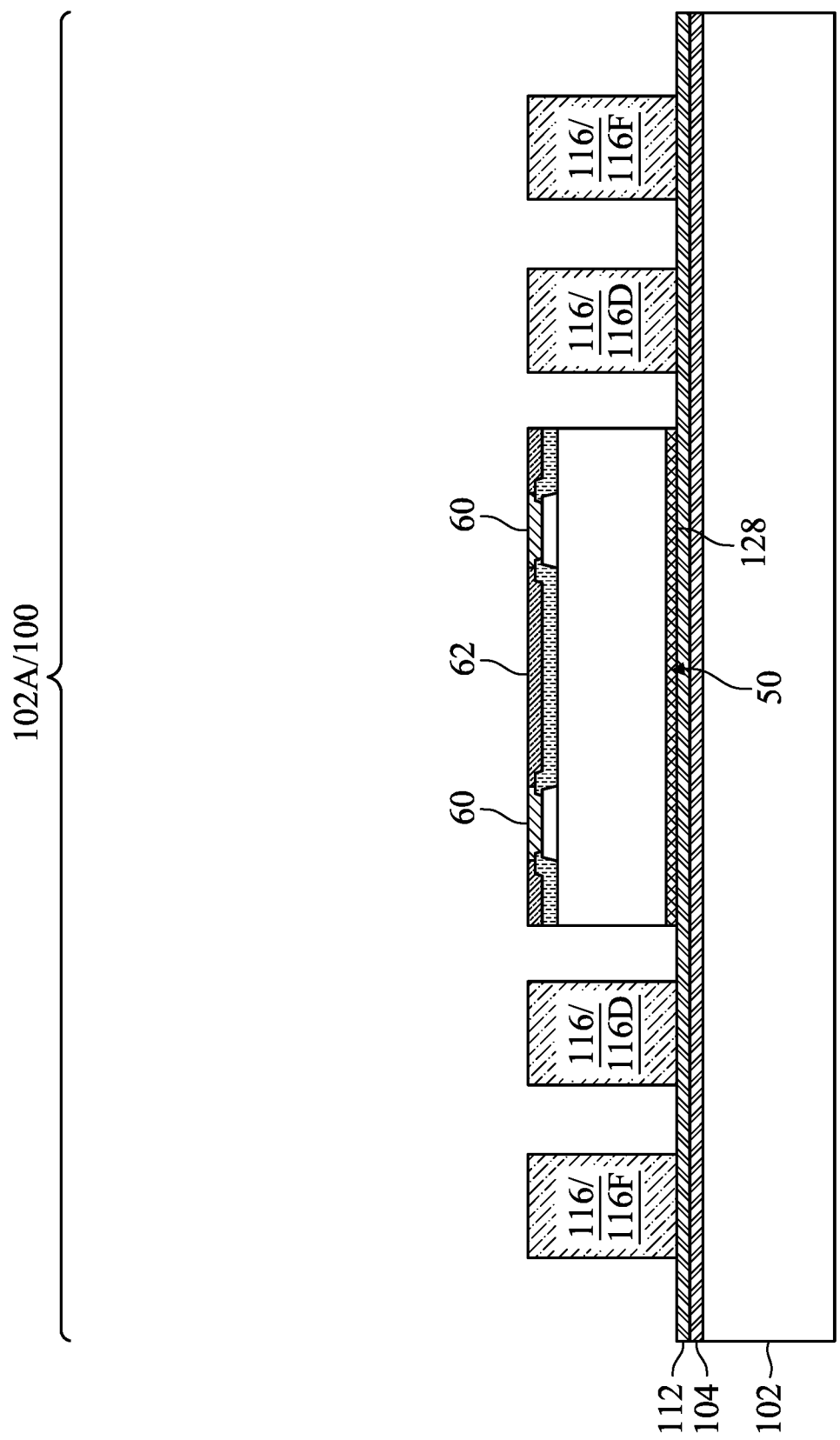

In FIG. 7, an integrated circuit die 50 is adhered to the dielectric layer 112 by an adhesive 128. The integrated circuit die 50 may be a logic device, such as a central processing unit (CPU), a graphics processing unit (GPU), a system-on-a-chip (SoC), a microcontroller, or the like. The integrated circuit die 50 may be a memory device, such as a dynamic random access memory (DRAM) die, a static random access memory (SRAM) die, a hybrid memory cube (HMC) module, a high bandwidth memory (HBM) module, or the like. Any desired type and quantity of integrated circuit dies 50 may adhered in the package region 102A.

The adhesive 128 is on a back side of the integrated circuit die 50 and adheres the integrated circuit die 50 to the dielectric layer 112. The adhesive 128 may be any suitable adhesive, epoxy, die attach film (DAF), or the like. The adhesive 128 may be applied to the back side of the integrated circuit die 50 or may be applied to the top surface of the dielectric layer 112. For example, the adhesive 128 may be applied to the back side of the integrated circuit die 50 before singulating to separate the integrated circuit die 50.

Figure 8:
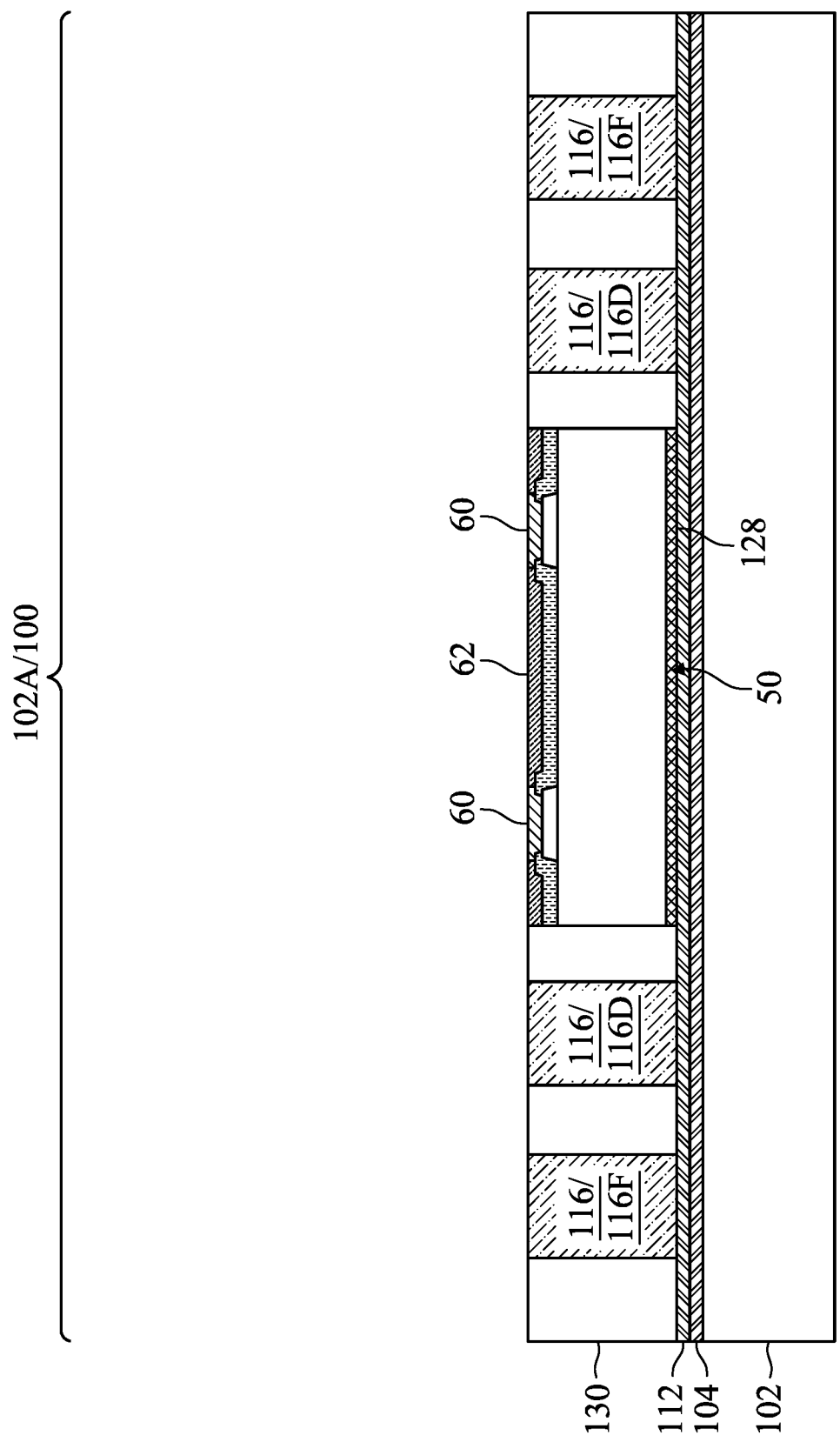

In FIG. 8, an encapsulant 130 is formed on and around the various components. After formation, the encapsulant 130 encapsulates the through vias 116 and the integrated circuit die 50. The encapsulant 130 may be a molding compound, epoxy, or the like. The encapsulant 130 may be applied by compression molding, transfer molding, or the like, and may be formed over the carrier substrate 102 such that the through vias 116 and/or the integrated circuit die 50 are buried or covered. When multiple integrated circuit dies 50 are in the package region 102A, the encapsulant 130 is further formed in gap regions between the integrated circuit dies 50. The encapsulant 130 may be applied in liquid or semi-liquid form and then subsequently cured.

Optionally, a removal process is performed on the encapsulant 130 to expose the through vias 116 and the die connectors 60. The removal process may also remove the materials of the through vias 116, the dielectric layer 62, and/or the die connectors 60 until the die connectors 60 and the through vias 116 are exposed. The removal process may be, for example, a planarization process such as chemical-mechanical polish (CMP), a grinding process, or the like. After the planarization process, the top surfaces of the encapsulant 130, the through vias 116 (including the functional through vias 116F and the dummy through vias 116D), and the integrated circuit die 50 (including the dielectric layer 62 and the die connectors 60) are substantially coplanar (within process variations). In some embodiments, the removal process may be omitted, for example, if the through vias 116 and/or the die connectors 60 are already exposed.

The through vias 116 extend through the encapsulant 130. Further, the through vias 116 (including the functional through vias 116F and the dummy through vias 116D) each have the same thickness as the encapsulant 130. In some embodiments, the encapsulant 130 and the through vias 116 have a thickness in the range of 200 μm to 350 μm. The through vias 116 may be referred to as through-mold vias (TMVs). In this embodiment, the TMVs have straight sidewalls. In another embodiment (subsequently described for FIG. 19), the TMVs have curved sidewalls.

Figure 9:
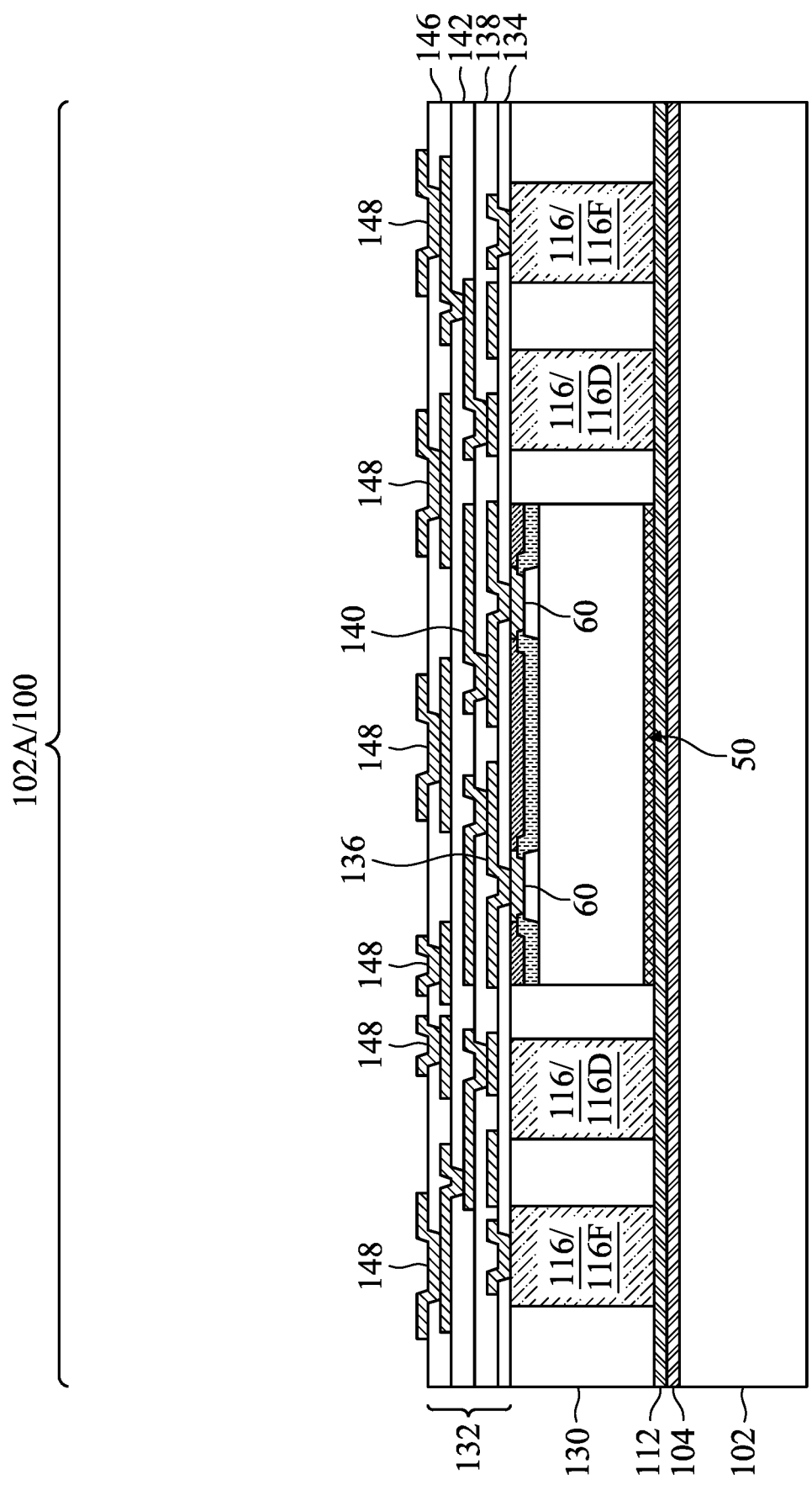

In FIG. 9, a front-side redistribution structure 132 is formed over the encapsulant 130, the through vias 116, and the integrated circuit die 50. The front-side redistribution structure 132 includes dielectric layers 134, 138, 142, 146; metallization patterns 136, 140, 144; and under-bump metallurgies (UBMs) 148. The metallization patterns 136, 140, 144 may also be referred to as redistribution layers or redistribution lines. The front-side redistribution structure 132 is shown as an example having three layers of metallization patterns 136, 140, 144. More or fewer dielectric layers and metallization patterns may be formed in the front-side redistribution structure 132. If fewer dielectric layers and metallization patterns are to be formed, the subsequently described steps and process may be omitted. If more dielectric layers and metallization patterns are to be formed, the subsequently described steps and processes may be repeated.

As an example to form the front-side redistribution structure 132, the dielectric layer 134 is deposited on the encapsulant 130, the through vias 116, and the die connectors 60. In some embodiments, the dielectric layer 134 is formed of a photo-sensitive material such as polybenzoxazole (PBO), polyimide, a benzocyclobutene (BCB) based polymer, or the like, which may be patterned using a lithography mask. The dielectric layer 134 may be formed by spin coating, lamination, CVD, the like, or a combination thereof. The dielectric layer 134 is then patterned. The patterning forms openings exposing portions of the functional through vias 116F and the die connectors 60. The openings in the dielectric layer 134 do not expose portions of the dummy through vias 116D. The patterning may be performed by an acceptable process, such as by exposing and developing the dielectric layer 134 to light when the dielectric layer 134 is a photo-sensitive material or by etching using, for example, an anisotropic etch.

The metallization pattern 136 is then formed. The metallization pattern 136 includes line portions on and extending along the major surface of the dielectric layer 134. The metallization pattern 136 further includes via portions extending through the dielectric layer 134 to physically and electrically couple the functional through vias 116F and the die connectors 60 of the integrated circuit die 50. The metallization pattern 136 does not physically or electrically couple the dummy through vias 116D. As such, the dummy through vias 116D are electrically isolated from the metallization pattern 136. As an example to form the metallization pattern 136, a seed layer is formed over the dielectric layer 134 and in the openings extending through the dielectric layer 134. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 136. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 136. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 138 is then deposited on the metallization pattern 136 and the dielectric layer 134. The dielectric layer 138 may be formed in a manner similar to the dielectric layer 134, and may be formed of a similar material as the dielectric layer 134.

The metallization pattern 140 is then formed. The metallization pattern 140 includes line portions on and extending along the major surface of the dielectric layer 138. The metallization pattern 140 further includes via portions extending through the dielectric layer 138 to physically and electrically couple the metallization pattern 136. The metallization pattern 140 may be formed in a similar manner and of a similar material as the metallization pattern 136. In some embodiments, the metallization pattern 140 has a different size than the metallization pattern 136. For example, the conductive lines and/or vias of the metallization pattern 140 may be wider or thicker than the conductive lines and/or vias of the metallization pattern 136. Further, the metallization pattern 140 may be formed to a greater pitch than the metallization pattern 136.

The dielectric layer 142 is then deposited on the metallization pattern 140 and the dielectric layer 138. The dielectric layer 142 may be formed in a manner similar to the dielectric layer 134, and may be formed of a similar material as the dielectric layer 134.

The metallization pattern 144 is then formed. The metallization pattern 144 includes line portions on and extending along the major surface of the dielectric layer 142. The metallization pattern 144 further includes via portions extending through the dielectric layer 142 to physically and electrically couple the metallization pattern 140. The metallization pattern 144 may be formed in a similar manner and of a similar material as the metallization pattern 136. The metallization pattern 144 is the topmost metallization pattern of the front-side redistribution structure 132. As such, all of the intermediate metallization patterns of the front-side redistribution structure 132 (e.g., the metallization patterns 136, 140) are disposed between the metallization pattern 144 and the integrated circuit die 50. In some embodiments, the metallization pattern 144 has a different size than the metallization patterns 136, 140. For example, the conductive lines and/or vias of the metallization pattern 144 may be wider or thicker than the conductive lines and/or vias of the metallization patterns 136, 140. Further, the metallization pattern 144 may be formed to a greater pitch than the metallization pattern 140.

The dielectric layer 146 is then deposited on the metallization pattern 144 and the dielectric layer 142. The dielectric layer 146 may be formed in a manner similar to the dielectric layer 134, and may be formed of the same material as the dielectric layer 134. The dielectric layer 146 is the topmost dielectric layer of the front-side redistribution structure 132. As such, all of the metallization patterns of the front-side redistribution structure 132 (e.g., the metallization patterns 136, 140, 144) are disposed between the dielectric layer 146 and the integrated circuit die 50. Further, all of the intermediate dielectric layers of the front-side redistribution structure 132 (e.g., the dielectric layers 134, 138, 142) are disposed between the dielectric layer 146 and the integrated circuit die 50.

The UBMs 148 are then formed for external connection to the front-side redistribution structure 132. The UBMs 148 include bump portions on and extending along the major surface of the dielectric layer 146. The UBMs 148 further include via portions extending through the dielectric layer 146 to physically and electrically couple the metallization pattern 144. As a result, the UBMs 148 are electrically coupled to the functional through vias 116F and the die connectors 60 of the integrated circuit die 50. The dummy through vias 116D are electrically isolated from the UBMs 148. The UBMs 148 may be formed of the same material as the metallization pattern 136, or may include a different material than the metallization pattern 136. In some embodiments, the UBMs 148 include multiple layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 148. Any suitable materials or layers of material may be used for the UBMs 148. In some embodiments, the UBMs 148 have a different (e.g., larger) size than the metallization patterns 136, 140, 144.

For high-performance devices with high bandwidth needs, such as application processors, the redistributions lines of the metallization pattern 136 have a small size (e.g., width and/or thickness) and/or a small pitch. For example, the redistributions lines of the metallization pattern 136 can have a width in the range of 2 µm to 5 µm, a thickness in the range of 5 µm to 7 µm, and a pitch in the range of 5 µm to 10 µm. The redistributions lines of the metallization pattern 136 with a small size and/or a small pitch are at a high risk of cracking if the encapsulant 130 undergoes thermal expansion during operation or testing. As will be subsequently described in greater detail for FIGS. 15-16, the dummy through vias 116D are disposed beneath some or all of the redistributions line(s) of the metallization pattern 136 in regions where there is a mismatch in coefficients of thermal expansion, such as proximate the border (e.g., edges and/or corners) of the integrated circuit die 50. The dummy through vias 116D may help suppress thermal expansion of the encapsulant 130, thereby reducing the risk of the redistributions line(s) cracking during operation or testing. Reliability of the resulting devices may thus be improved.

Figure 10:
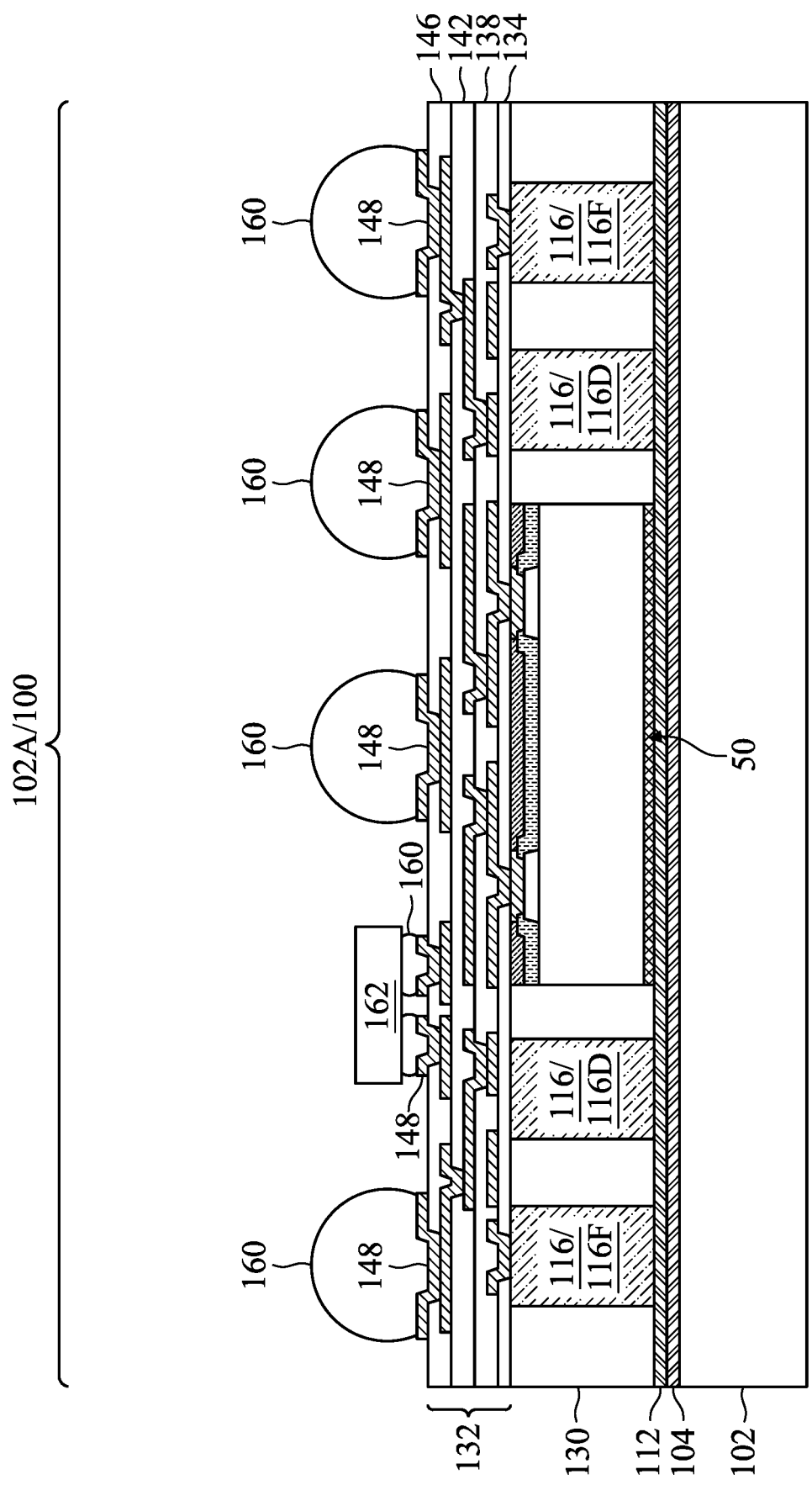

In FIG. 10, conductive connectors 160 are formed on the UBMs 148. The conductive connectors 160 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 160 may include a conductive material such as solder, copper, aluminum, gold, nickel, silver, palladium, tin, the like, or a combination thereof. In some embodiments, the conductive connectors 160 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 160 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Optionally, a passive device 162 is connected to a subset of the UBMs 148 with a subset of the conductive connectors 160. The passive device 162 may be an integrated passive device (IPD), such as a surface mount device (SMD), a 2-terminal IPD, a multi-terminal IPD, or other type of passive device. The passive device 162 can include a main structure and one or more passive devices in the main structure. The main structure can be, e.g., a semiconductor substrate, an encapsulant, or the like. The passive devices may include capacitors, resistors, inductors, the like, or a combination thereof, which can be formed in and/or on the main structure. The passive device 162 can be connected to the UBMs 148 by reflowing the conductive connectors 160. In some embodiments, an underfill (not separately illustrated) can be formed between the topmost dielectric layer of the front-side redistribution structure 132 (e.g., the dielectric layer 146) and the passive device 162. Any desired type and quantity of passive devices 162 may be connected in the package region 102A.

Figure 11:
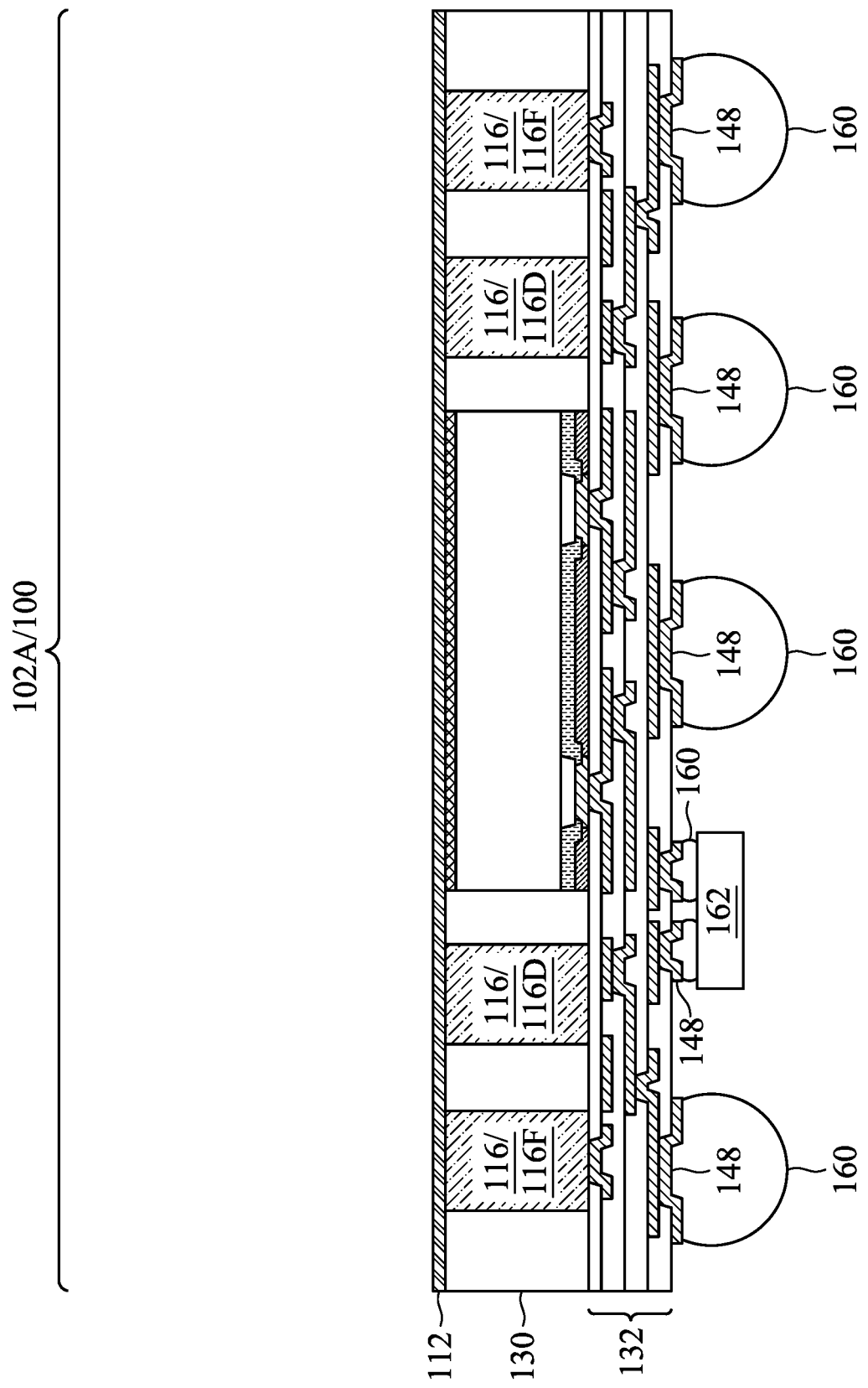

In FIG. 11, a carrier substrate de-bonding is performed to detach (or "de-bond") the carrier substrate 102 from the dielectric layer 112. In accordance with some embodiments, the de-bonding includes projecting a light such as a laser light or an UV light on the release layer 104 so that the release layer 104 decomposes under the heat of the light and the carrier substrate 102 can be removed. The structure may then be flipped over and placed on a tape (not separately illustrated).

Figure 12:
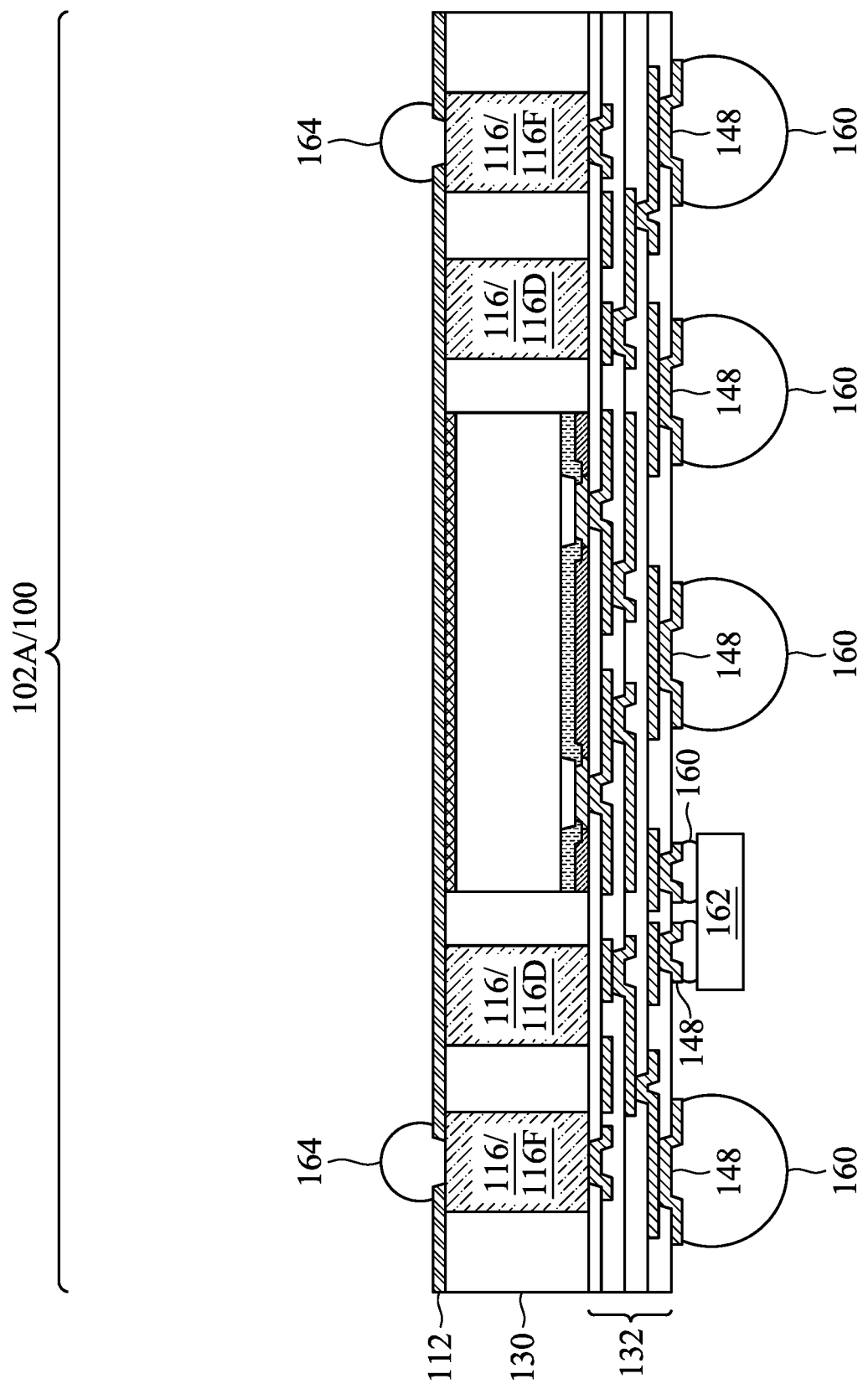

In FIG. 12, conductive connectors 164 are formed extending through the dielectric layer 112 to contact the functional through vias 116F. Openings are formed through the dielectric layer 112 to expose portions of the functional through vias 116F. The openings may be formed, for example, using laser drilling, etching, or the like. The conductive connectors 164 are formed in the openings. In some embodiments, the conductive connectors 164 comprise flux and are formed in a flux dipping process. In some embodiments, the conductive connectors 164 comprise a conductive paste such as solder paste, silver paste, or the like, and are dispensed in a printing process. In some embodiments, the conductive connectors 164 are formed in a manner similar to the conductive connectors 160, and may be formed of a similar material as the conductive connectors 160.

The conductive connectors 164 do not contact the dummy through vias 116D. As such, the dummy through vias 116D are electrically isolated from the conductive connectors 164. Further, the dummy through vias 116D are electrically isolated from the conductive features (e.g., the metallization patterns 136, 140, 144 and the UBMs 148) of the front-side redistribution structure 132. The sidewalls of the dummy through vias 116D are covered by the encapsulant 130, and the end surfaces of the dummy through vias 116D are covered by the dielectric layers 112, 134. As such, the dummy through vias 116D are surrounded on all sides by insulating material(s), and are electrically floating.

Figure 13:
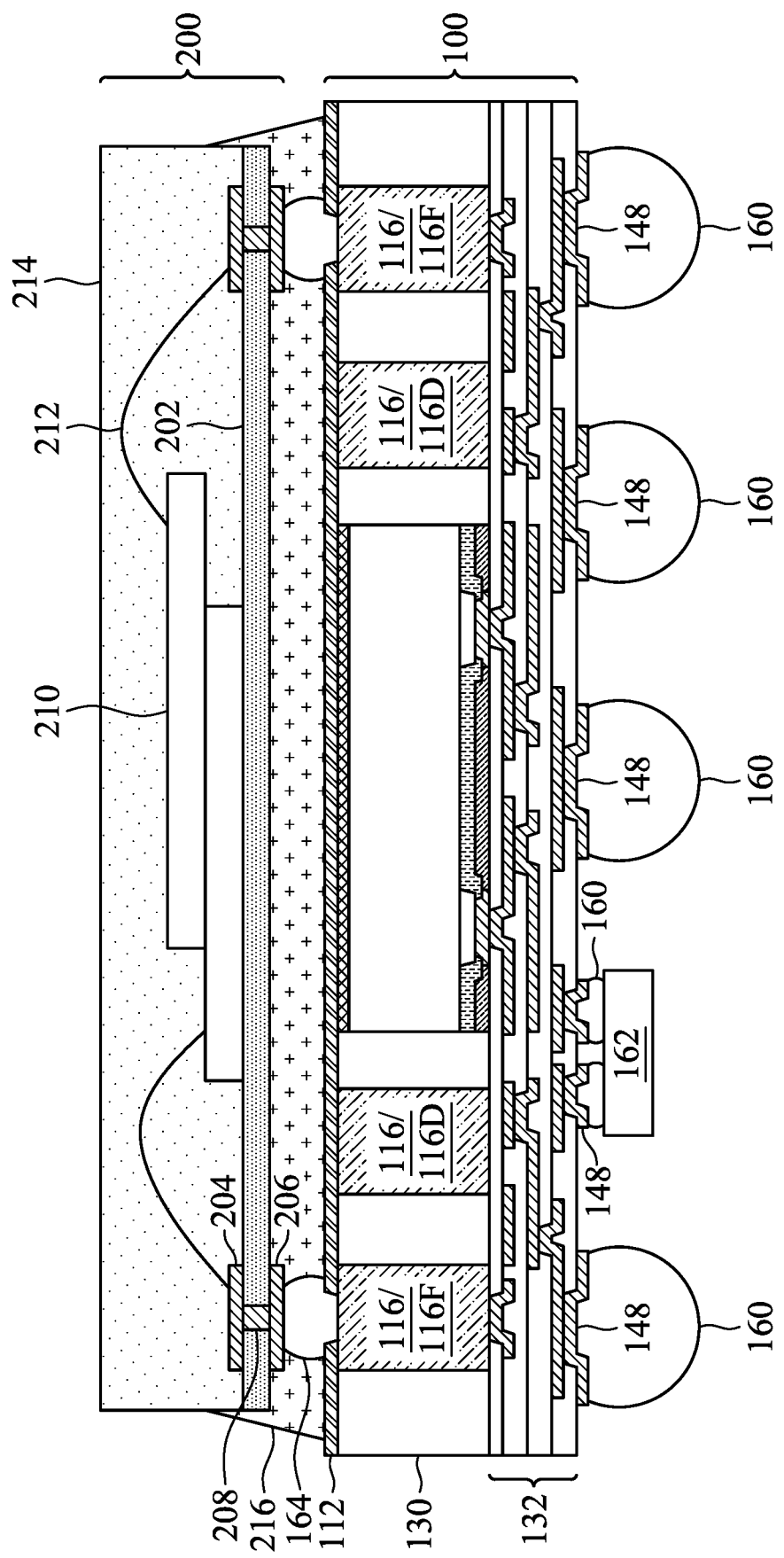

In FIG. 13, a singulation process is performed by sawing along scribe line regions, e.g., around the package region 102A. The sawing singulates the package region 102A from adjacent package regions (not separately illustrated). The resulting, singulated first integrated circuit package 100 is from the package region 102A. After singulation, the dielectric layer 112, the encapsulant 130, and the front-side redistribution structure 132 are laterally coterminous.

A second integrated circuit package 200 can be attached to the first integrated circuit package 100 to form a package-on-package structure. The second integrated circuit package 200 may be a memory device package. The second integrated circuit package 200 can be attached to the first integrated circuit package 100 before or after the first integrated circuit package 100 is singulated.

The second integrated circuit package 200 includes, for example, a substrate 202 and one or more stacked dies 210 coupled to the substrate 202. Although one set of stacked dies 210 is illustrated, in other embodiments, a plurality of stacked dies 210 (each having one or more stacked dies) may be disposed side-by-side coupled to a same surface of the substrate 202. The substrate 202 may be formed of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not separately illustrated). A wide variety of devices such as transistors, capacitors, resistors, combinations of these, and the like may be used to generate the structural and functional requirements of the design for the second integrated circuit package 200. The devices may be formed using any suitable methods.

The substrate 202 may also include metallization layers (not separately illustrated) and conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 164. In some embodiments, the bond pads 204, 206 are formed by forming recesses (not separately illustrated) into dielectric layers (not separately illustrated) on the first and second sides of the substrate 202. The recesses may be formed to allow the bond pads 204, 206 to be embedded into the dielectric layers. In other embodiments, the recesses are omitted as the bond pads 204, 206 may be formed on the dielectric layer. In some embodiments, the bond pads 204, 206 include a thin seed layer (not separately illustrated) formed of copper, titanium, nickel, gold, palladium, the like, or a combination thereof. The conductive material of the bond pads 204, 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204, 206 is copper, tungsten, aluminum, silver, gold, the like, or a combination thereof.

In some embodiments, the bond pads 204, 206 are UBMs that include multiple layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204, 206. Any suitable materials or layers of material may be used for the bond pads 204, 206. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a removal process, such as a planarization process or a grinding process, is performed to remove excess portions of the molding material 214 and provide a substantially planar surface for the second integrated circuit package 200.

After the second integrated circuit package 200 is formed, the second integrated circuit package 200 is mechanically and electrically bonded to the first integrated circuit package 100 by way of the conductive connectors 164. In some embodiments, the stacked dies 210 may be coupled to the integrated circuit die 50 through the wire bonds 212, the bond pads 204, 206, the conductive vias 208, the conductive connectors 164, the through vias 116, and the front-side redistribution structure 132. The dummy through vias 116D are electrically isolated from the stacked dies 210 and the integrated circuit die 50.

In some embodiments, a solder resist (not separately illustrated) is formed on the side of the substrate 202 opposing the stacked dies 210. The conductive connectors 164 may be disposed in openings in the solder resist to be electrically and mechanically coupled to conductive features (e.g., the bond pads 206) in the substrate 202. The solder resist may be used to protect areas of the substrate 202 from external damage.

In some embodiments, an underfill 216 is formed between the first integrated circuit package 100 and the second integrated circuit package 200, surrounding the conductive connectors 164. The underfill 216 may reduce stress and protect the joints resulting from the reflowing of the conductive connectors 164. The underfill 216 may be formed by a capillary flow process after the second integrated circuit package 200 are attached, or may be formed by a suitable deposition method before the second integrated circuit package 200 are attached.

In some embodiments, the conductive connectors 164 have an epoxy flux (not separately illustrated) formed thereon before they are reflowed with at least some of the epoxy portion of the epoxy flux remaining after the second integrated circuit package 200 are attached to the first integrated circuit package 100. In embodiments where the epoxy flux is formed, it may act as the underfill 216. The underfill 216 may be formed in addition to or in lieu of the epoxy flux.

Figure 14:
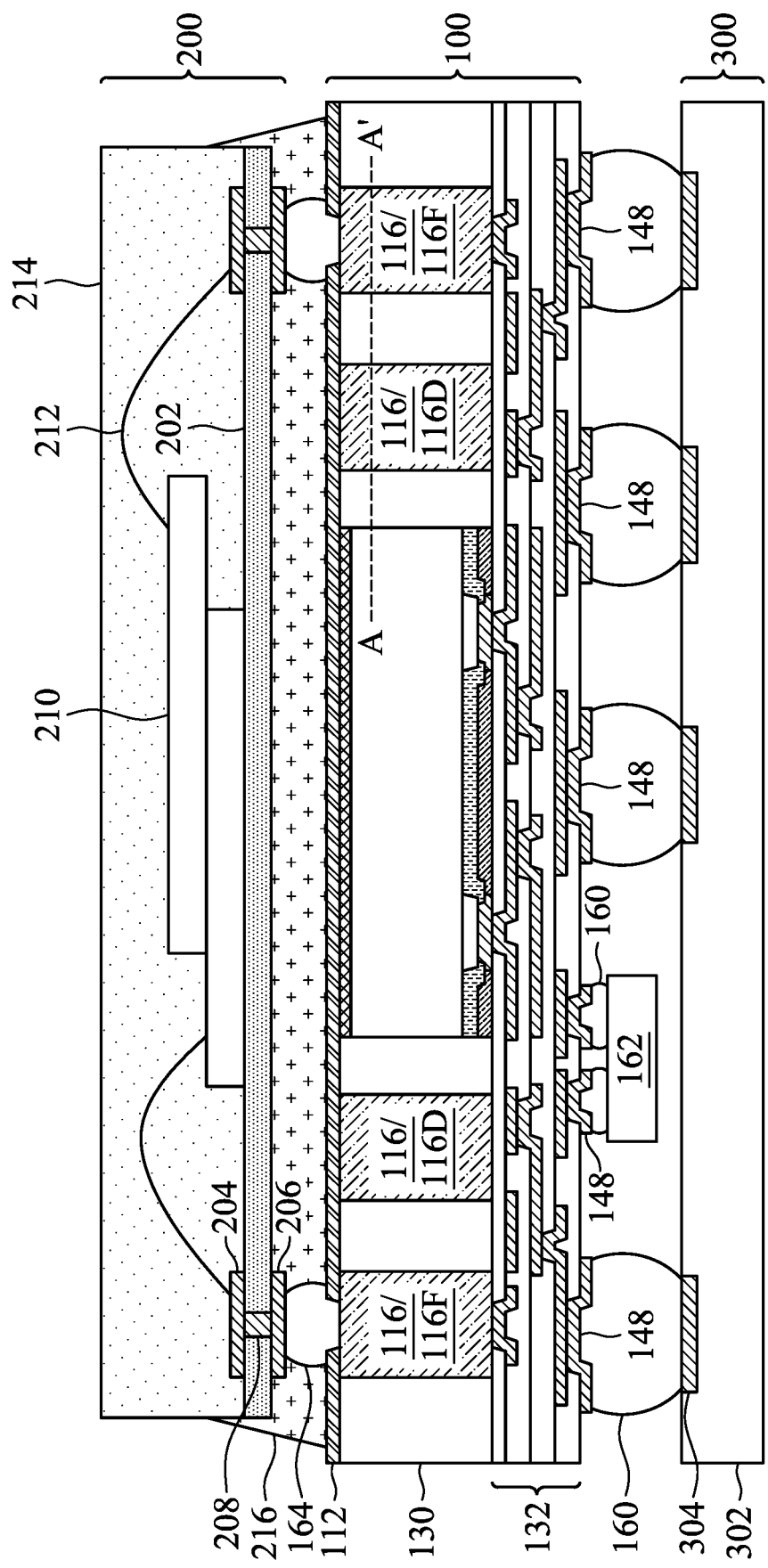

In FIG. 14, the package-on-package structure is mounted to a package substrate 300 using the conductive connectors 160. The package substrate 300 includes a substrate core 302 and bond pads 304 over the substrate core 302. The substrate core 302 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not separately illustrated). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias, with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 160 are reflowed to attach the first integrated circuit package 100 to the bond pads 304. The conductive connectors 160 electrically and/or physically couple the package substrate 300, including metallization layers in the substrate core 302, to the first integrated circuit package 100. In some embodiments, a solder resist (not separately illustrated) is formed on the substrate core 302. The conductive connectors 160 may be disposed in openings in the solder resist to be electrically and mechanically coupled to the bond pads 304. The solder resist may be used to protect areas of the substrate core 302 from external damage.

The conductive connectors 160 may have an epoxy flux (not separately illustrated) formed thereon before they are reflowed with at least some of the epoxy portion of the epoxy flux remaining after the first integrated circuit package 100 is attached to the package substrate 300. This remaining epoxy portion may act as an underfill to reduce stress and protect the joints resulting from reflowing the conductive connectors 160. In some embodiments, an underfill (not separately illustrated) is formed between the first integrated circuit package 100 and the package substrate 300 and surrounding the conductive connectors 160. The underfill may be formed by a capillary flow process after the first integrated circuit package 100 is attached or may be formed by a suitable deposition method before the first integrated circuit package 100 is attached.

In some embodiments, passive devices (e.g., surface mount devices (SMDs), not separately illustrated) may also be attached to the package substrate 300 (e.g., to the bond pads 304). For example, the passive devices may be bonded to a same surface of the package substrate 300 as the conductive connectors 160. The passive devices may be attached to the package substrate 300 prior to or after mounting the first integrated circuit package 100 on the package substrate 300.

The first integrated circuit package 100 may be implemented in other integrated circuit devices. For example, a PoP structure is shown, but the first integrated circuit package 100 may also be implemented in a Flip Chip Ball Grid Array (FCBGA) package. In such embodiments, the first integrated circuit package 100 is mounted to a substrate such as the package substrate 300, but the second integrated circuit package 200 is omitted. Instead, a lid or heat spreader may be attached to the first integrated circuit package 100. When the second integrated circuit package 200 is omitted, the functional through vias 116F may also be omitted. In either case, the dummy through vias 116D are formed to suppress thermal expansion of the encapsulant 130.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 15:
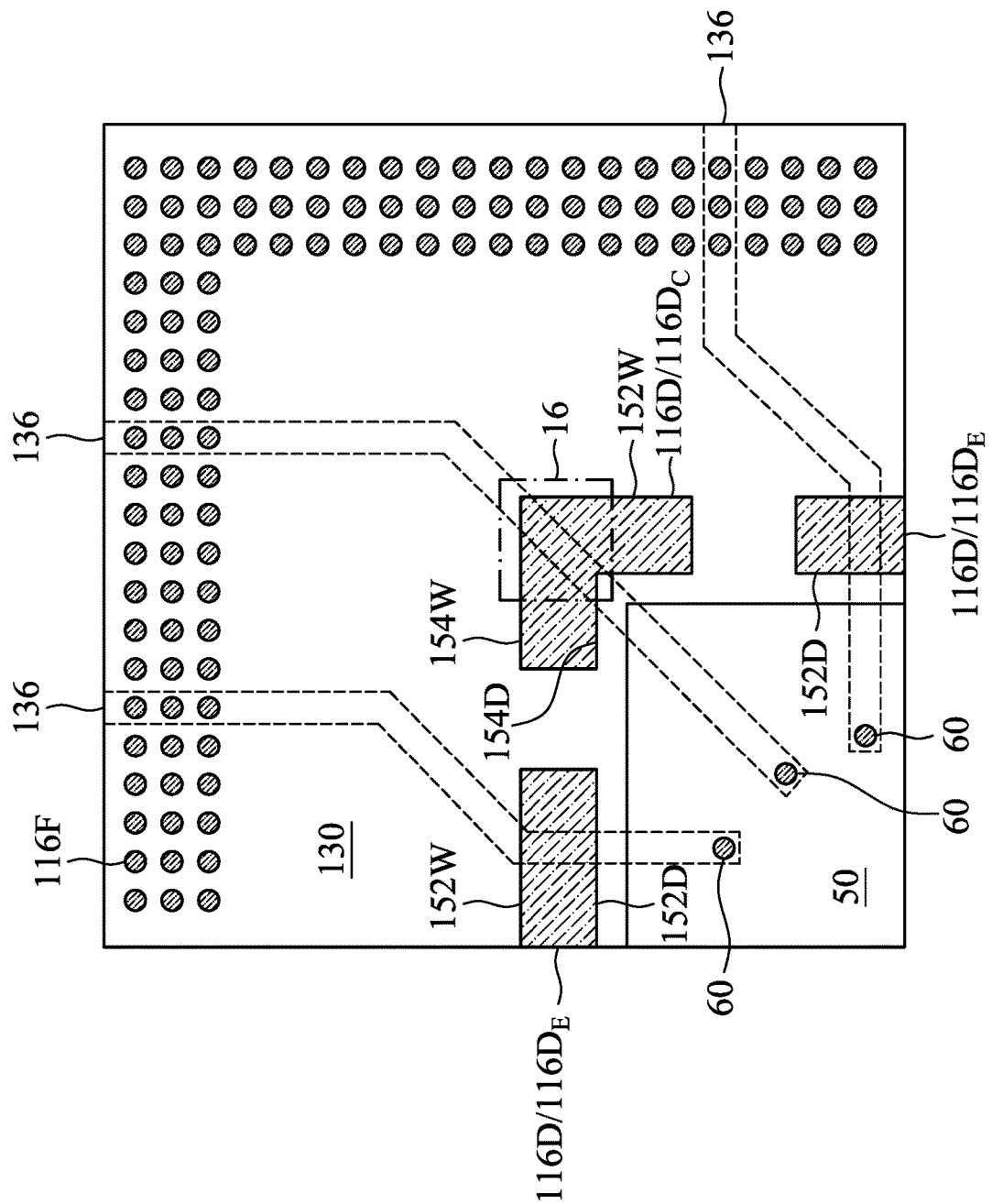
FIGS. 15-16 are top-down views of an integrated circuit device, in accordance with some embodiments.
Figure 16:
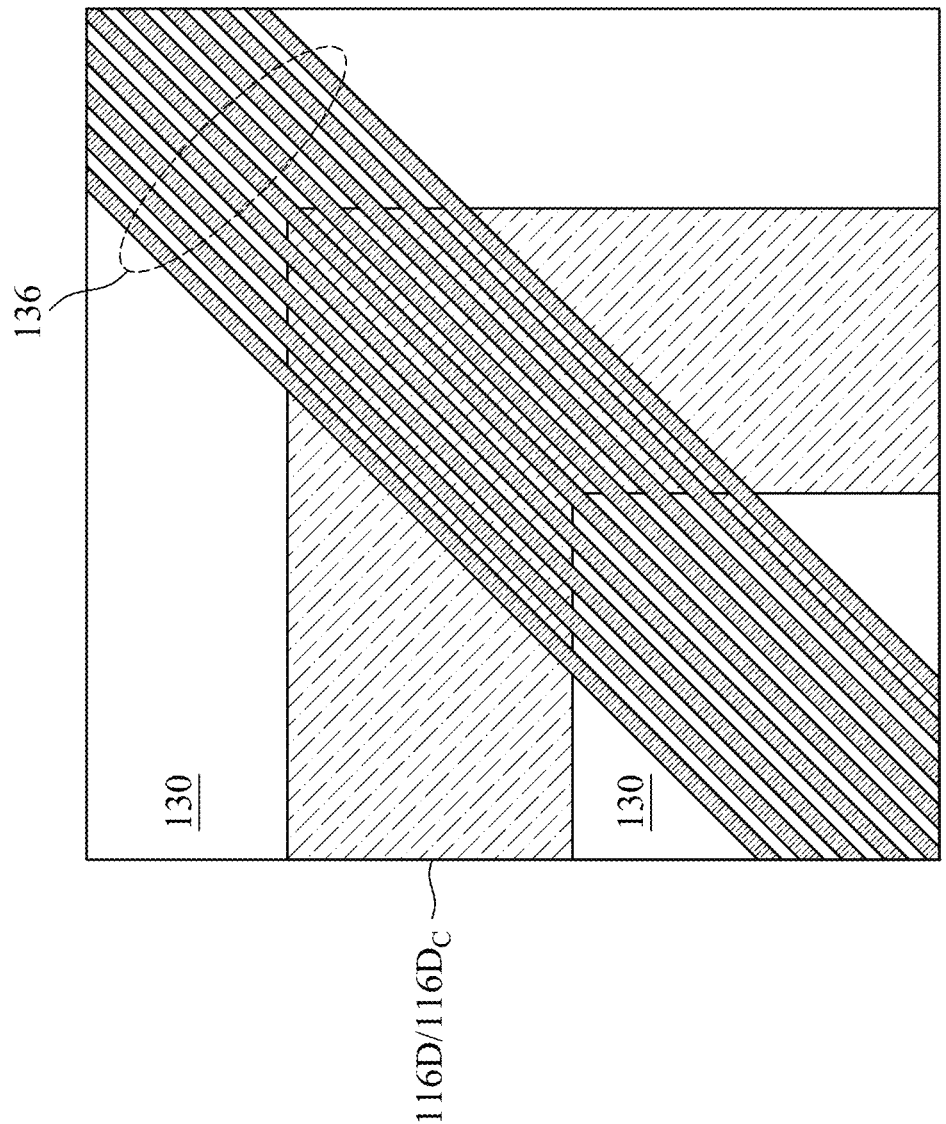

FIGS. 15-16 are top-down views of an integrated circuit device, in accordance with some embodiments. FIG. 15 is shown along a similar cross-section as cross-section A-A in FIG. 14, except at a corner of the integrated circuit die 50. Additionally, multiple dummy through vias 116D and functional through vias 116F are shown, and a portion of the metallization pattern 136 is shown in ghost. FIG. 16 is a detailed view of a region 16 in FIG. 15.

Some redistribution lines of the metallization pattern 136 extending over some regions, such as regions proximate the border (e.g., edges and/or corners) of the integrated circuit die 50, are at an increased risk of cracking. In particular, the metallization pattern 136 can have a small size and/or a small pitch proximate the border of the integrated circuit die 50, as the redistribution lines of the metallization pattern 136 in such regions have not fanned out very much. The redistribution lines of the metallization pattern 136 with a small size and/or a small pitch are at a high risk of cracking if the encapsulant 130 undergoes thermal expansion during operation or testing. Thermal expansion of the encapsulant 130 may occur during operation or testing as a result of mismatched coefficients of thermal expansion between the encapsulant 130 and the integrated circuit die 50. The dummy through vias 116D are disposed directly beneath the redistribution lines of the metallization pattern 136 in regions where there is a mismatch in coefficients of thermal expansion, such as at the border of the integrated circuit die 50, and provide mechanical support for those redistribution lines of the metallization pattern 136. As such, the redistribution lines of the metallization pattern 136 overlap the dummy through vias 116D in the top-down view. Advantageously, because the dummy through vias 116D are formed of a conductive material, they have a large Young's modulus and a low coefficient of thermal expansion. The dummy through vias 116D may have a greater Young's modulus than the encapsulant 130. In some embodiments, the dummy through vias 116D have a Young's modulus in the range of 90 GPa to 150 GPa. The dummy through vias 116D with a large Young's modulus provide good mechanical support for overlying features, as they are less likely than the encapsulant 130 to deform under compressive or tensile strain, thereby reducing the risk of the redistribution lines cracking. The dummy through vias 116D may have a smaller coefficient of thermal expansion than the encapsulant 130. In some embodiments, the dummy through vias 116D have a coefficient of thermal expansion in the range of 12 ppm/° C. to 20 ppm/° C. The dummy through vias 116D with a small coefficient of thermal expansion may help suppress thermal expansion of the encapsulant 130 during operation or testing, thereby reducing the risk of the redistribution lines cracking. Reducing the risk of the redistribution lines cracking may improve device reliability.

A first subset of the dummy through vias $116D_E$ are disposed at the edges of the integrated circuit die 50. Each dummy through via $116D_E$ is I-shaped, and extends along a direction parallel to an adjacent edge of the integrated circuit die 50. Specifically, a dummy through via $116D_E$ has a length measured in a direction parallel to an adjacent edge of the integrated circuit die 50, and a width measured in a direction perpendicular to the adjacent edge of the integrated circuit die 50, with the length being greater than the width. In some embodiments, the dummy through via $116D_E$ has a length in the range of 110 μm to 220 μm or the range of 220 μm to 600 μm, and has a width in the range of 90 μm to 180 μm. Further, the dummy through via $116D_E$ has a first sidewall 152D that faces towards the adjacent edge of the integrated circuit die 50, and has a second sidewall 152W that faces away from the adjacent edge of the integrated circuit die 50. One or more redistribution line(s) of the metallization pattern 136 cross over the dummy through via $116D_E$ such that each of the redistribution line(s) intersects the first sidewall 152D and the second sidewall 152W in the top-down view.

A second subset of the dummy through vias $116D_C$ are disposed at the corners of the integrated circuit die 50. Each dummy through via $116D_C$ is L-shaped, and extends along the two directions parallel to the edges of the integrated circuit die 50 that define the adjacent corner. Specifically, a dummy through via $116D_C$ has two segments, where each segment extends along a direction parallel to an adjacent edge of the integrated circuit die 50, and where each segment has a length measured in a direction parallel to the adjacent edge of the integrated circuit die 50, and a width measured in a direction perpendicular to the adjacent edge of the integrated circuit die 50, with the length being greater than the width. In some embodiments, each segment of the dummy through via $116D_C$ has a length in the range of 110 μm to 220 μm or the range of 220 μm to 600 μm, and has a width in the range of 90 μm to 180 μm. Further, the dummy through via $116D_C$ has a plurality of first sidewalls 154D that each face towards a respective adjacent edge of the integrated circuit die 50, and has a plurality of second sidewalls 154W that each face away from a respective adjacent edge of the integrated circuit die 50. One or more redistribution line(s) of the metallization pattern 136 cross over the dummy through via $116D_C$ such that each of the redistribution line(s) intersects a first sidewall 154D and a second sidewall 154W in the top-down view.

The dummy through vias 116D are proximate the border of integrated circuit die 50, and the functional through vias 116F are distal the integrated circuit die 50, such that the dummy through vias 116D are disposed closer to the integrated circuit die 50 than the functional through vias 116F. In the top-down view, the dummy through vias 116D are disposed between the integrated circuit die 50 and the functional through vias 116F. Specifically, the dummy through vias 116D are disposed around the integrated circuit die 50, and the functional through vias 116F are disposed around the dummy through vias 116D. Some of the redistribution line(s) of the metallization pattern 136 are physically and electrically coupled to a die connector 60 of the integrated circuit die 50 and to a functional through vias 116F. Some or all of those redistribution line(s) of the metallization pattern 136 cross over the dummy through vias 116D.

Additionally, as previously noted, the dummy through vias 116D may have different shapes and/or sizes than the functional through vias 116F in the top-down view. In this embodiment, the dummy through vias 116D are larger than the functional through vias 116F in the top-down view. For example, the dummy through vias 116D may have a greater width than the functional through vias 116F. Also this embodiment, the dummy through vias 116D have different shapes than the functional through vias 116F in the top-down view. For example, the dummy through vias 116D may be I-shaped or L-shaped, while the functional through vias 116F are O-shaped.

As noted above, one or more redistribution line(s) of the metallization pattern 136 cross over the dummy through vias 116D. FIG. 15 is a simplified view only illustrating one redistribution line of the metallization pattern 136 extending over each dummy through via 116D. It should be appreciated that multiple redistribution lines of the metallization pattern 136 may cross over a dummy through via 116D, as illustrated by FIG. 16. In some embodiments, from 12 to 30 redistribution lines may cross over each dummy through via 116D.

Embodiments may achieve advantages. The dummy through vias 116D are formed in regions where there is a mismatch in coefficients of thermal expansion, such as proximate the border (e.g., edges and/or corners) of the integrated circuit die 50. Placing the dummy through vias 116D in such regions may help suppress thermal expansion of the encapsulant 130 during operation or testing. The redistribution lines of the metallization pattern 136 may thus have a decreased risk of cracking, particularly when the redistribution lines have a small size (e.g., width and/or thickness) and/or a small pitch. In an experiment, including the dummy through vias 116D in the first integrated circuit package 100 reduced the cracking risk by about 13%. Reliability of the resulting devices may thus still be improved.

Figure 17:
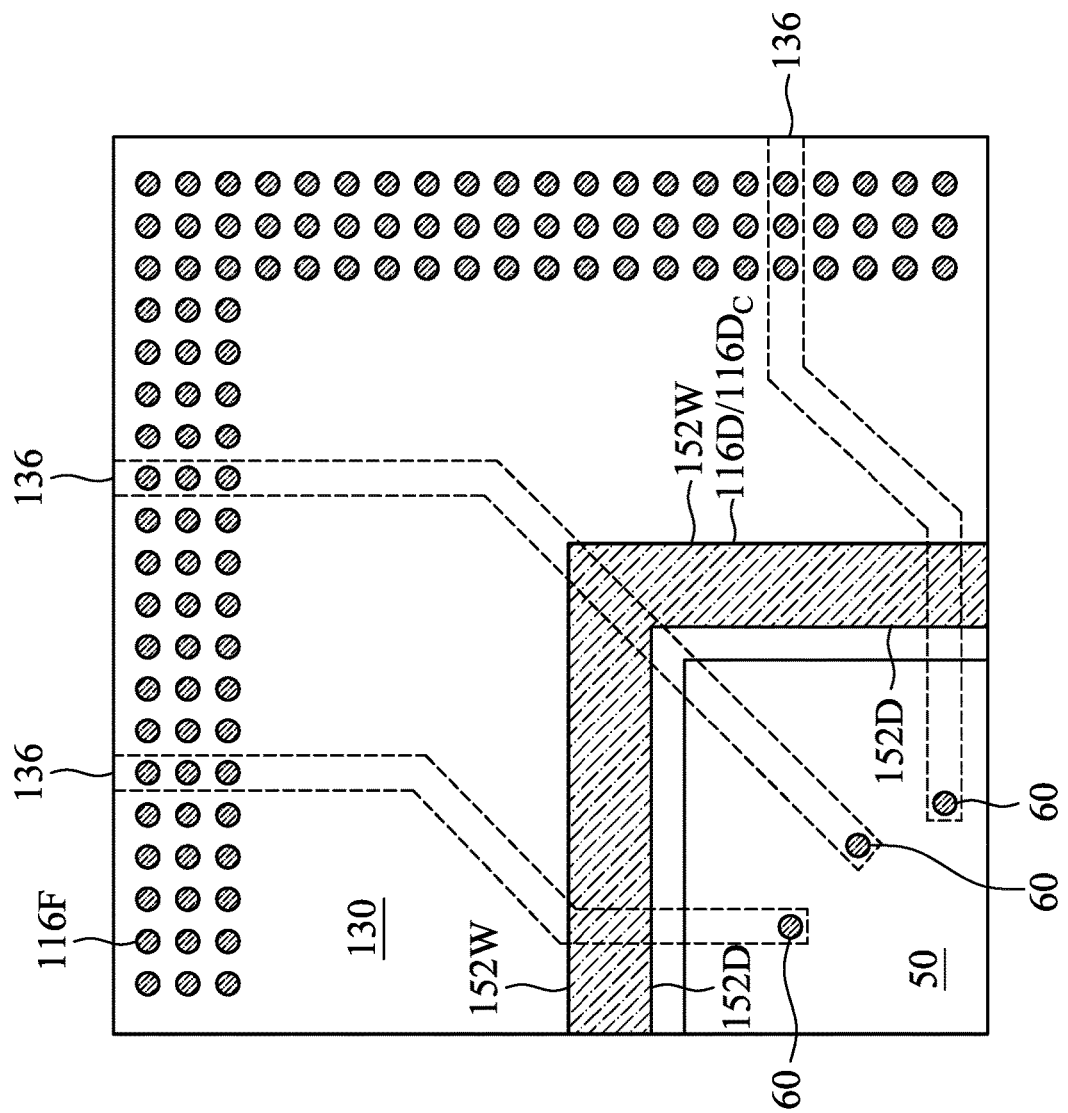
FIG. 17 is a top-down view of an integrated circuit device, in accordance with some other embodiments.

FIG. 17 is a top-down view of an integrated circuit device, in accordance with some other embodiments. This embodiment is similar to the embodiment of FIG. 15, except the redistribution line(s) of the metallization pattern 136 are grouped into subsets that cross over different segments of the dummy through vias 116D$_C$. For example, a first subset of the redistribution line(s) of the metallization pattern 136 may cross over sidewalls 152D, 152W of a first segment of a dummy through via 116D$_C$, and a second subset of the redistribution line(s) of the metallization pattern 136 may cross over sidewalls 152D, 152W of a second segment of the dummy through via 116D$_C$.

Figure 18:
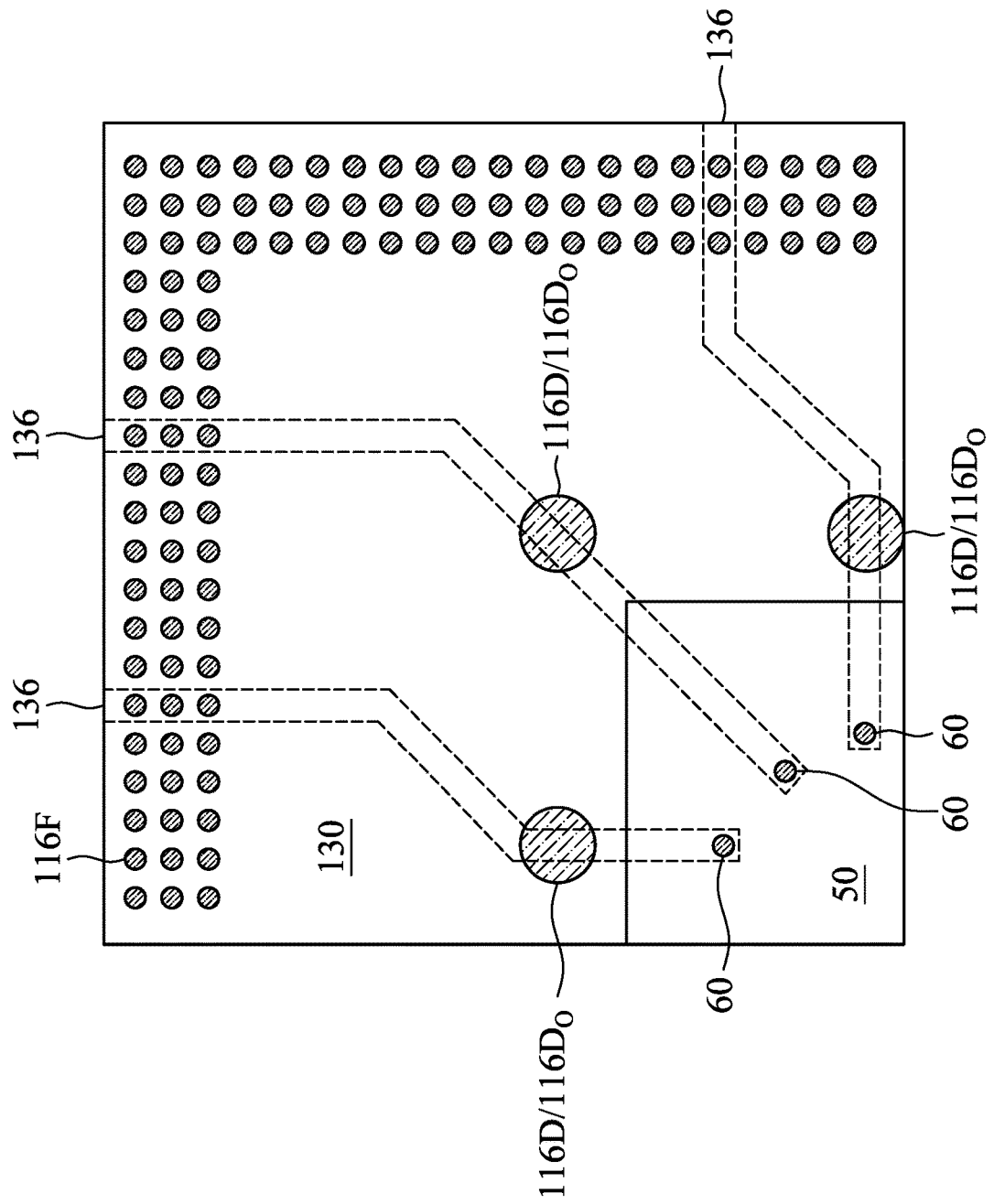
FIG. 18 is a top-down view of an integrated circuit device, in accordance with some other embodiments.

FIG. 18 is a top-down view of an integrated circuit device, in accordance with some other embodiments. This embodiment is similar to the embodiment of FIG. 15, except the functional through vias 116F and the dummy through vias 116D (including the dummy through vias 116D$_O$ at the edges and/or corners of the integrated circuit die 50) are both O-shaped. Thus, the dummy through vias 116D have the same shape as the functional through vias 116F in the top-down view, but the dummy through vias 116D still have different sizes than the functional through vias 116F in the top-down view. The dummy through vias 116D may thus still help suppress thermal expansion of the encapsulant 130 during operation or testing.

Figure 19:
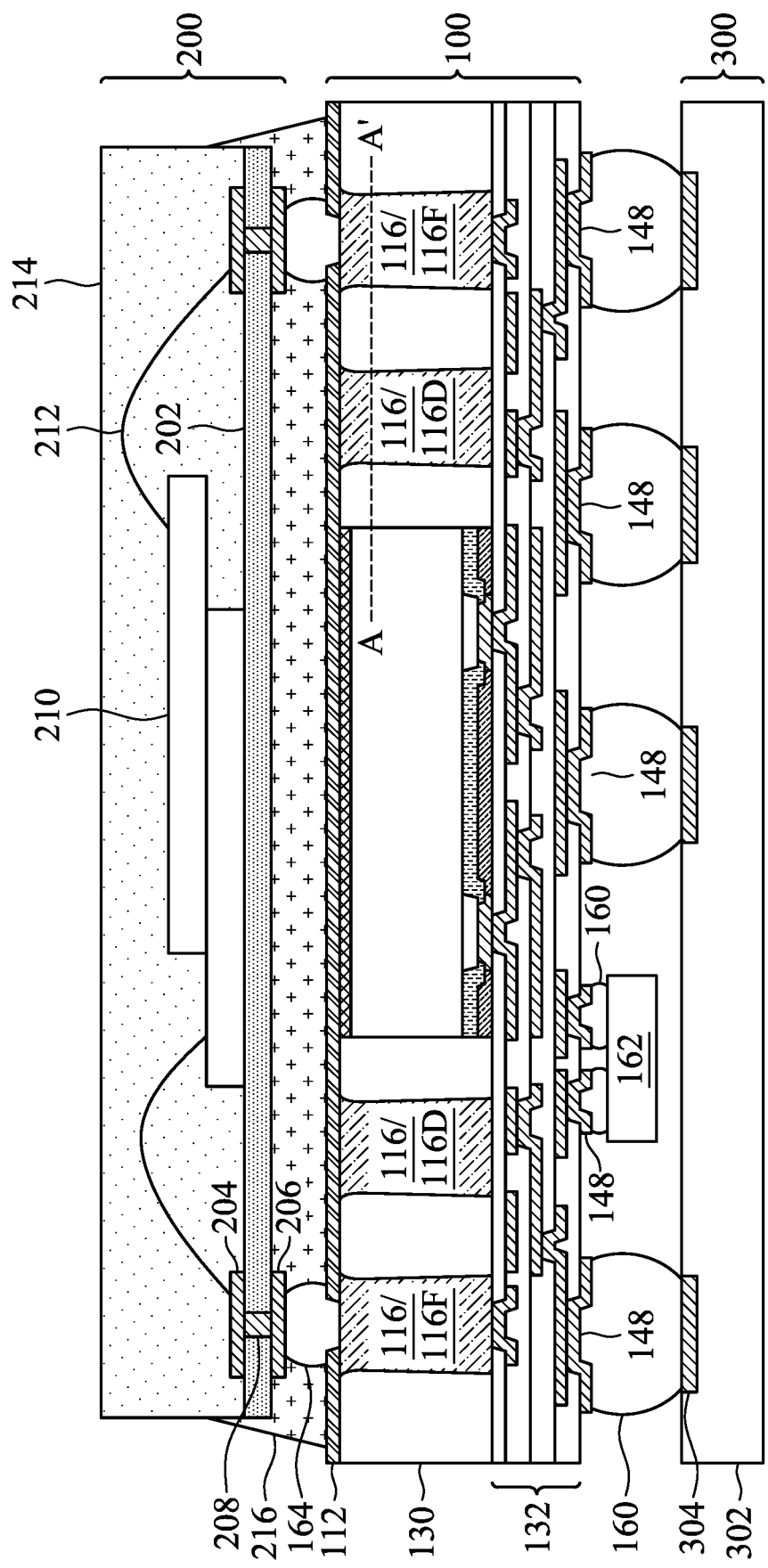
FIG. 19 is a cross-sectional view of an integrated circuit device, in accordance with some other embodiments.

FIG. 19 is a cross-sectional view of an integrated circuit device, in accordance with some other embodiments. This embodiment is similar to the embodiment described for FIG. 14, except the through vias 116 (including the functional through vias 116F and the dummy through vias 116D) have curved sidewalls. As a result, the interface between each through via 116 and the encapsulant 130 is curved. The curved sidewalls of the through vias 116 may be concave sidewalls.

In an embodiment, a device includes: an integrated circuit die including a die connector; a first through via adjacent the integrated circuit die; an encapsulant encapsulating the first through via and the integrated circuit die; and a redistribution structure on the encapsulant, the redistribution structure including a redistribution line, the redistribution line physically and electrically coupled to the die connector of the integrated circuit die, the redistribution line electrically isolated from the first through via, the redistribution line crossing over the first through via. In some embodiments of the device, the first through via is I-shaped in a top-down view and is disposed at an edge of the integrated circuit die. In some embodiments of the device, the first through via is L-shaped in a top-down view and is disposed at a corner of the integrated circuit die. In some embodiments of the device, the first through via is O-shaped in a top-down view. In some embodiments, the device further includes: a second through via, the encapsulant encapsulating the second through via, the redistribution line physically and electrically coupled to the second through via. In some embodiments of the device, the first through via, the second through via, and the encapsulant have a same thickness. In some embodiments of the device, the first through via includes a same structure of conductive layers as the second through via. In some embodiments of the device, the first through via is disposed closer to a border of the integrated circuit die than the second through via.

In an embodiment, a device includes: an integrated circuit die including a die connector; an encapsulant encapsulating the integrated circuit die; a functional through via extending through the encapsulant; a dummy through via extending through the encapsulant, the dummy through via disposed between the functional through via and the integrated circuit die in a top-down view, the dummy through via surrounded on all sides by insulating material; and a redistribution structure crossing over the dummy through via, the functional through via, and the encapsulant, the redistribution structure including a redistribution line, the redistribution line physically and electrically coupled to the functional through via and to the die connector of the integrated circuit die. In some embodiments of the device, the functional through via includes a first adhesion layer and a first main layer, the dummy through via includes a second adhesion layer and a second main layer, the first adhesion layer and the second adhesion layer include a first conductive material, the first main layer and the second main layer include a second conductive material, and the first conductive material is different from the second conductive material. In some embodiments of the device, the first adhesion layer and the second adhesion layer have a same first thickness, and the first main layer and the second main layer have a same second thickness. In some embodiments of the device, a top surface of the encapsulant is substantially coplanar with a top surface of the functional through via, a top surface of the dummy through via, and a top surface of the integrated circuit die. In some embodiments of the device, the redistribution line extends over the dummy through via. In some embodiments of the device, the dummy through via has a different shape than the functional through via in the top-down view. In some embodiments of the device, the dummy through via has a different size than the functional through via in the top-down view. In some embodiments of the device, the dummy through via has a first sidewall and a second sidewall, the first sidewall facing towards the integrated circuit die, the second sidewall facing away from the integrated circuit die, the redistribution line intersecting the first sidewall and the second sidewall in the top-down view.

In an embodiment, a method includes: placing an integrated circuit die adjacent a first conductive via and a second conductive via; encapsulating the integrated circuit die, the first conductive via, and the second conductive via with a molding compound; depositing a dielectric layer on the molding compound, the first conductive via, and the second conductive via; and forming a metallization pattern having a line portion and a via portion, the line portion extending along a surface of the dielectric layer, the via portion extending through the dielectric layer to physically and electrically couple the first conductive via and a die connector of the integrated circuit die, the second conductive via remaining covered by the dielectric layer. In some embodiments, the method further includes: patterning a mask on a seed layer, the mask including a first opening and a second opening; plating a conductive material in the first opening and the second opening of the mask; and removing the mask and exposed portions of the seed layer to form the first conductive via and the second conductive via, the first conductive via including a first portion of the conductive material in the first opening, the second conductive via including a second portion of the conductive material in the second opening. In some embodiments, the method further includes: connecting a memory device to the first conductive via, the second conductive via electrically isolated from the memory device and the metallization pattern. In some embodiments of the method, the line portion of the metallization pattern extends over the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    an integrated circuit die comprising a die connector;
    a first through via adjacent the integrated circuit die;
    a second through via, the first through via having a greater width than the second through via, the first through via disposed between the second through via and the integrated circuit die;
    an encapsulant encapsulating the first through via, the second through via, and the integrated circuit die; and
    a redistribution structure on the encapsulant, the redistribution structure comprising a redistribution line, the redistribution line physically and electrically coupled to the die connector of the integrated circuit die, the redistribution line electrically isolated from the first through via, the redistribution line crossing over the first through via, the redistribution line physically and electrically coupled to the second through via.

2. The device of claim 1, wherein the first through via is I-shaped in a top-down view and is disposed at an edge of the integrated circuit die.

3. The device of claim 1, wherein the first through via is L-shaped in a top-down view and is disposed at a corner of the integrated circuit die.

4. The device of claim 1, wherein the first through via is O-shaped in a top-down view.

5. The device of claim 1, wherein the first through via, the second through via, and the encapsulant have a same thickness.

6. The device of claim 1, wherein the first through via comprises a same structure of conductive layers as the second through via.

7. The device of claim 1, wherein the first through via is disposed closer to a border of the integrated circuit die than the second through via.

8. A device comprising:
    an integrated circuit die comprising a die connector;
    an encapsulant encapsulating the integrated circuit die;
    a functional through via extending through the encapsulant;
    a dummy through via extending through the encapsulant, the dummy through via disposed between the functional through via and the integrated circuit die in a top-down view, the dummy through via having a greater width than the functional through via in the top-down view, the dummy through via surrounded on all sides by insulating material; and
    a redistribution structure crossing over the dummy through via, the functional through via, and the encapsulant, the redistribution structure comprising a redistribution line, the redistribution line physically and electrically coupled to the functional through via and to the die connector of the integrated circuit die.

9. The device of claim 8, wherein the functional through via comprises a first adhesion layer and a first main layer, the dummy through via comprises a second adhesion layer and a second main layer, the first adhesion layer and the second adhesion layer comprise a first conductive material, the first main layer and the second main layer comprise a second conductive material, and the first conductive material is different from the second conductive material.

10. The device of claim 9, wherein the first adhesion layer and the second adhesion layer have a same first thickness, and wherein the first main layer and the second main layer have a same second thickness.

11. The device of claim 8, wherein a top surface of the encapsulant is substantially coplanar with a top surface of the functional through via, a top surface of the dummy through via, and a top surface of the integrated circuit die.

12. The device of claim 8, wherein the redistribution line extends over the dummy through via.

13. The device of claim 8, wherein the dummy through via has a different shape than the functional through via in the top-down view.

14. The device of claim 8, wherein the dummy through via has a first sidewall and a second sidewall, the first sidewall facing towards the integrated circuit die, the second sidewall facing away from the integrated circuit die, the redistribution line intersecting the first sidewall and the second sidewall in the top-down view.

15. A method comprising:
    placing an integrated circuit die adjacent a first conductive via and a second conductive via, the second conductive via comprising a first segment and a second segment, the first segment extending along a first edge of the integrated circuit die in a first direction that is parallel to the first edge of the integrated circuit die, the second segment extending along a second edge of the integrated circuit die in a second direction that is parallel to the second edge of the integrated circuit die, the second direction being perpendicular to the first direction;
    encapsulating the integrated circuit die, the first conductive via, and the second conductive via with a molding compound;
    depositing a dielectric layer on the molding compound, the first conductive via, and the second conductive via; and
    forming a metallization pattern having a line portion and a via portion, the line portion extending along a surface of the dielectric layer, the via portion extending through the dielectric layer to physically and electrically couple the first conductive via and a die connector of the integrated circuit die, the second conductive via remaining covered by the dielectric layer.

16. The method of claim 15 further comprising:
    patterning a mask on a seed layer, the mask comprising a first opening and a second opening;
    plating a conductive material in the first opening and the second opening of the mask; and
    removing the mask and exposed portions of the seed layer to form the first conductive via and the second conductive via, the first conductive via comprising a first portion of the conductive material in the first opening, the second conductive via comprising a second portion of the conductive material in the second opening.

17. The method of claim 15 further comprising:
    connecting a memory device to the first conductive via, the second conductive via electrically isolated from the memory device and the metallization pattern.

18. The method of claim 15, wherein the line portion of the metallization pattern extends over the second conductive via.

19. The method of claim 15, wherein the first segment has a first length measured in the first direction, a first width measured in the second direction, and the first length is greater than the first width.

20. The method of claim 15, wherein the first conductive via has a larger size and a different shape than the second conductive via.

* * * * *